(12) United States Patent
Kato et al.

(10) Patent No.: US 8,193,606 B2
(45) Date of Patent: Jun. 5, 2012

(54) SEMICONDUCTOR DEVICE INCLUDING A MEMORY ELEMENT

(75) Inventors: Kiyoshi Kato, Isehara (JP); Yasuyuki Arai, Atsugi (JP); Satoshi Seo, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 903 days.

(21) Appl. No.: 11/354,821

(22) Filed: Feb. 16, 2006

(65) Prior Publication Data

US 2006/0203533 A1  Sep. 14, 2006

(30) Foreign Application Priority Data

Feb. 28, 2005 (JP) ................................. 2005-055216

(51) Int. Cl.
*H01L 29/00* (2006.01)

(52) U.S. Cl. ................ 257/536; 257/E21.645; 365/148; 438/99

(58) Field of Classification Search .................... 257/40, 257/347, 532, 536, E21.645; 365/163, 148; 438/99, 110, 112
See application file for complete search history.

(56) References Cited

U.S. PATENT DOCUMENTS

| | | | | |
|---|---|---|---|---|
| 5,075,738 A | * | 12/1991 | Matsuda et al. | 257/49 |
| 5,687,112 A | * | 11/1997 | Ovshinsky | 365/163 |
| 5,714,768 A | * | 2/1998 | Ovshinsky et al. | 257/40 |
| 5,933,365 A | * | 8/1999 | Klersy et al. | 365/148 |
| 6,194,746 B1 | * | 2/2001 | Gonzalez et al. | 257/104 |
| 6,310,808 B1 | * | 10/2001 | Tanizaki | 365/203 |
| 6,656,763 B1 | * | 12/2003 | Oglesby et al. | 438/99 |
| 6,803,267 B1 | | 10/2004 | Subramanian et al. | |
| 6,864,522 B2 | | 3/2005 | Krieger et al. | |
| 6,900,517 B2 | * | 5/2005 | Tanaka et al. | 257/532 |
| 6,977,389 B2 | | 12/2005 | Tripsas et al. | |
| 6,979,387 B2 | | 12/2005 | Takeuchi et al. | |
| 7,075,105 B2 | * | 7/2006 | Kano | 257/40 |
| 7,605,410 B2 | | 10/2009 | Takano et al. | |

(Continued)

FOREIGN PATENT DOCUMENTS

EP   0 224 418   6/1987

(Continued)

OTHER PUBLICATIONS

Office Action (Application No. 200610051510.7) Dated Oct. 31, 2008.

*Primary Examiner* — William F Kraig
(74) *Attorney, Agent, or Firm* — Eric J. Robinson; Robinson Intellectual Property Law Office, P.C.

(57) ABSTRACT

To provide a memory element that positively utilizes a phenomenon such as a dielectric breakdown, differently from a conventional memory element, and to provide a memory device having an increased memory capacity. The invention provides a memory device having a pair of electrodes and multiple memory material layers stacked between the electrodes, and an operating method thereof, where the memory material layers are sequentially destroyed by applying voltage. For example, in the case of stacking two memory material layers in the memory device, the memory device is operated in such a manner that a first voltage is applied to the pair of electrodes to destroy one of the two memory material layers, and then a second voltage is applied thereto to destroy the other of the two memory material layers.

90 Claims, 16 Drawing Sheets

U.S. PATENT DOCUMENTS

| | | |
|---|---|---|
| 7,768,014 B2 | 8/2010 | Asami |
| 2004/0026729 A9 * | 2/2004 | Krieger et al. ............... 257/306 |
| 2004/0147111 A1 * | 7/2004 | Huang et al. ................ 438/624 |
| 2004/0150113 A1 * | 8/2004 | Tonegawa ................... 257/758 |
| 2004/0196688 A1 * | 10/2004 | Yamamoto et al. ........... 365/154 |
| 2004/0246770 A1 * | 12/2004 | Kano ........................... 365/154 |
| 2004/0265253 A1 * | 12/2004 | Seo et al. ....................... 424/63 |
| 2005/0007217 A1 * | 1/2005 | Deligianni et al. ............. 335/78 |
| 2006/0245235 A1 * | 11/2006 | Krieger et al. ................ 365/115 |
| 2010/0038618 A1 | 2/2010 | Takano et al. |
| 2010/0273302 A1 | 10/2010 | Asami |

FOREIGN PATENT DOCUMENTS

| | | |
|---|---|---|
| JP | 02-058264 A | 2/1990 |
| JP | 06-076562 A | 3/1994 |
| JP | 11-039860 A | 2/1999 |
| JP | 2001-345431 | 12/2001 |
| JP | 2002-026283 | 1/2002 |
| JP | 2003-188355 A | 7/2003 |
| JP | 2004-304180 | 10/2004 |

* cited by examiner 202   201

SEMICONDUCTOR DEVICE INCLUDING A MEMORY ELEMENT

BACKGROUND OF THE INVENTION

1. Field of the Invention

The present invention relates to a semiconductor device having a memory device that has a pair of electrodes and memory material layers stacked therebetween, and an operating method thereof.

2. Description of the Related Art

Conventionally, a memory device with a multilayer structure has been proposed in order to increase a memory capacity (see Patent Document 1). Patent document 1 discloses a memory device having a memory portion composed of multiple memory cells that are arranged in a two-dimensional matrix, which is formed by staking memory layers.

In addition, such a multilayered memory device that has a stable organic-layered element with a multilayer structure has been proposed, which has a pair of electrodes and layers stacked therebetween, where the stacked layers include two or more organic thin films each having a different dielectric constant (see Patent Document 2).

However, as disclosed in Japanese Patent Laid-Open No. 2001-345431 (Patent Document 3) that is disclosed in Patent Document 2, a memory element utilizing such organic ferroelectric thin films has a problem in that a dielectric breakdown occurs when an opposite electric field is applied thereto.

[Patent Document 1] Japanese Patent Laid-Open No. 2002-26283

[Patent Document 2] Japanese Patent Laid-Open No. 2004-304180

[Patent Document 3] Japanese Patent Laid-Open No. 2001-345431

In the case of a memory device having a multilayer structure as shown in Patent Document 1, the thickness of the device itself is increased. Since a memory device is often mounted as a component of an electronic appliance, the increased thickness of the device will restrict the layout of the device. Further, since each layer of a memory element in the memory device is required to be connected to a driver circuit, the circuit configuration becomes complex.

Patent Document 2 discloses a stable organic-layered memory element and a memory device and a driving method of these, where a difference between the threshold voltage for writing data and the threshold voltage for erasing data can be varied. Patent document 3 poses a problem in that a dielectric breakdown might occur when an opposite electric field is applied.

SUMMARY OF THE INVENTION

In view of the foregoing, it is a primary object of the invention to provide a memory device with an increased memory capacity, which has a different structure from those disclosed in Patent Documents 1 to 3, and yet has a memory element that positively utilizes a phenomenon such as a dielectric breakdown, unlike the memory elements disclosed in Patent Documents 2 and 3.

The invention provides a memory device having a pair of electrodes and memory material layers stacked therebetween, and an operating method thereof, where the memory material layers are sequentially destroyed by applying voltage. For example, in the case of stacking two memory material layers, the memory device is operated in such a manner that a first voltage is applied (first voltage application) to the pair of electrodes to destroy one of the two memory material layers, and a second voltage is subsequently applied (second voltage application) to destroy the other of the two memory material layers.

Note that "to destroy a memory material layer" means that layers provided to sandwich the destroyed/broken memory material layer are short-circuited. For example, as a destruction of a memory material layer, there is a dielectric breakdown. In addition, there is a case where layers provided to sandwich a memory material layer are short-circuited by heating the memory material layer up to the glass-transition temperature or higher so that the memory material layer is softened or melted to be changed in state.

In this manner, in order to destroy one of the two memory material layers (referred to as a first memory material layer) by applying a first voltage, the dielectric constant of the first material layer is varied from that of the other memory material layer (referred to as a second memory material layer). Since a higher voltage of between the divided voltage is applied to the layer having a lower dielectric constant, the layer having the lower dielectric constant is destroyed first in the case where the two memory material layers have about the same level of the withstand voltage.

Alternatively, the withstand voltage per unit thickness (hereinafter referred to as a withstand voltage) may be varied between each memory material layer of the invention. Also, in the case where two memory material layers have about the same dielectric constant, the layer having a lower withstand voltage is destroyed first.

In addition to the dielectric constant or the withstand voltage, the thickness of each memory material layer may be varied. For example, the second memory material layer may be formed to be 1.1 to 5 times thicker than the first memory material layer. At this time, each of the first and second memory material layers is formed to have a thickness of 5 to 500 nm, or preferably 10 to 100 nm in consideration of the thickness with which a dielectric breakdown occurs. In this manner, when a thin memory material layer is used, the layer can be destroyed by applying a low voltage.

Further, in order to soften or melt the first memory material layer of the memory element of the invention by applying the first voltage, it is preferable to form the first memory material layer and the second memory material layer to have different glass-transition temperatures (Tg) from each other. For example, the first memory material layer and the second memory material layer are formed to have a difference of 10° C. or more in glass-transition temperature.

Further, each memory material layer of the memory device of the invention may be selected in consideration of the dielectric constant, withstand voltage, thickness and glass-transition temperature altogether.

In the memory device of the invention, an additional material (layer) may be formed between multiple memory material layers. For example, there is an organic-inorganic composite material, a heat-generating material or a conductive material. Such material may be provided in the form of a film or a cluster since it is formed extremely thin.

The invention provides a semiconductor device having a bottom electrode, layers stacked over the bottom electrode, and a top electrode over the stacked layers, where each of the stacked layers has a different dielectric constant or withstand voltage.

A semiconductor device in accordance with another aspect of the invention has a bottom electrode, layers stacked over the bottom electrode, and a top electrode over the stacked layers, where each of the stacked layers has a different glass-transition temperature.

A semiconductor device in accordance with another aspect of the invention has a bottom electrode, first and second layers that are sequentially stacked over the bottom electrode, and top electrode over the second layer, where the first layer has a lower dielectric constant than the second layer.

A semiconductor device in accordance with another aspect of the invention has a bottom electrode, first and second layers that are sequentially stacked over the bottom electrode, and a top electrode over the second layer, where the first layer has a lower withstand voltage than the second layer.

A semiconductor device in accordance with another aspect of the invention has a bottom electrode, first and second layers that are sequentially stacked over the bottom electrode, and a top electrode over the second layer, where the first layer has a lower glass-transition temperature than the second layer.

One feature of the invention is that the second layer is thicker than the first layer.

In addition, the invention provides an operating method of a semiconductor device having a bottom electrode, a top electrode, and first and second layers sandwiched between the electrodes, where a first voltage is applied to destroy the first layer, thereby short-circuiting the bottom electrode and the second layer; and a second voltage is applied to destroy the second layer, thereby short-circuiting the bottom electrode and the top electrode.

In an operating method of a semiconductor device in accordance with another aspect of the invention, which has a memory element having a bottom electrode, a top electrode, and first and second layers sandwiched between the electrodes, and a transistor connected to the memory element, a first voltage is applied to destroy the first layer, thereby flowing a current into the memory element; a second voltage is applied to destroy the second layer, thereby flowing a current into the memory element; and data is written into the memory element by using the first voltage value and the second voltage value.

In an operating method of a semiconductor device in accordance with another aspect of the invention, which has a bottom electrode, a top electrode, and a first layer formed of an inorganic material and a second layer formed of an organic material that are sandwiched between the electrodes, a first voltage is applied to destroy the first layer formed of an inorganic material, thereby short-circuiting the bottom electrode and the second layer; and a second voltage is applied to destroy the second layer formed of an organic material, thereby short-circuiting the bottom electrode and the top electrode.

In an operating method of a semiconductor device in accordance with another aspect of the invention, which has a memory element having a bottom electrode, a top electrode, a first layer formed of an inorganic material and a second layer formed of an organic material that are sandwiched between the electrodes, and a transistor connected to the memory element, a first voltage is applied to destroy the first layer formed of an inorganic material, thereby flowing a current into the memory element; a second voltage is applied to the second layer formed of an organic material, thereby flowing a current into the memory element; and data is written into the memory element by using the first voltage value and the second voltage value.

In accordance with the invention, a memory capacity of a memory element can be increased. That is, multivalued data can be written into the memory element.

In addition, since the memory element of the invention can be formed over the same substrate as a circuit for controlling the element, the memory device can be manufactured at low cost. In particular, when a passive memory element is adopted, the memory device can be reduced in size.

Further, since the memory element of the invention can be provided over a resin substrate, reduction in thickness and weight as well as an improvement in shock resistance can be achieved.

DETAILED DESCRIPTION OF THE INVENTION

Figure 1A:
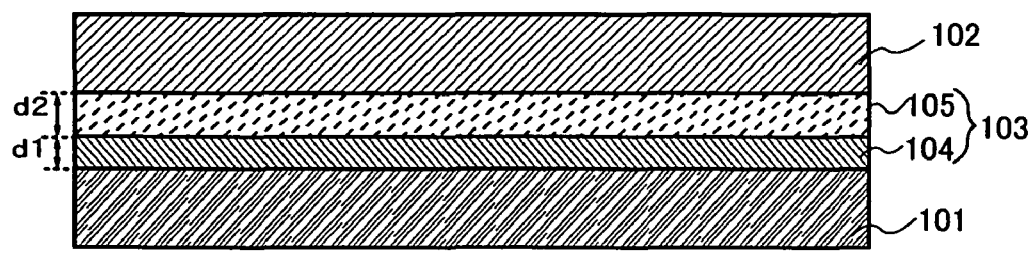
FIGS. 1A and 1B are cross-sectional views of memory elements of the invention.

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein. Note that common portions or portions having a similar function are denoted by common reference numerals in all the drawings for illustrating embodiment modes, and therefore, description thereon will be made only once.

[Embodiment Mode 1]

In this embodiment mode, description is made on one memory element in a memory device. As shown in FIG. 1A, the memory element has a bottom electrode 101, a top electrode 102 and a memory material layer 103 sandwiched therebetween. In the memory material layer 103, a first memory material layer 104 and a second memory material layer 105 are stacked in this order. Note that the invention has one feature of providing multiple memory material layers between a pair of electrodes, and therefore it is not limited to two memory material layers. Such memory material layers may be formed by vapor deposition, spin coating or a droplet discharge method typified by ink-jet deposition.

Each of the bottom electrode 101 and the top electrode 102 may be formed by using a conductive material such as an element selected from among aluminum (Al), titanium (Ti), molybdenum (Mo), tungsten (W) or silicon (Si), or an alloy containing such elements. Alternatively, another light-transmissive material may be used such as indium tin oxide (ITO), indium tin oxide containing silicon oxide (ITSO) or indium oxide containing 2 to 20% of zinc oxide. Such conductive materials may be deposited by sputtering, vapor deposition, a droplet discharge method or the like. The deposited materials are then patterned into a predetermined shape as required, thereby forming the bottom electrode 101 and the top electrode 102.

Note that it is preferable to employ the vapor deposition or the droplet discharge method since the bottom electrode 101, the memory material layer 103 and the top electrode 102 can be continuously formed by using such a method. This is because the interface between each layer can be prevented from contamination.

Description is made below on a method for destroying the memory material layers of such memory element, in the case where the memory material layers are formed by using inorganic materials such as silicon oxide, silicon nitride or silicon oxynitride. First, the first memory material layer and the second memory material layer are formed to have different dielectric constants so that either of the first memory material layer or the second memory material layer is destroyed by applying a first voltage. For example, the dielectric constant of the first memory material layer is set lower than that of the second memory material layer. Since a layer having a lower dielectric constant generates a high electric field given that the both layers have about the same withstand voltage, the layer having a lower dielectric constant is destroyed first. By reading a difference in resistance values in a graph showing the voltage-current characteristics between before and after the first memory material layer is destroyed, multivalued data can be written into the memory element.

As such a low-dielectric constant (low-k) material, there is an inorganic material or an organic material. As the inorganic material, there is a $SiO_2$ film that is doped with C and H to lower the dielectric constant. As the organic material, there is polyarylether having minute holes inside, amorphous Teflon (Japanese trademark), polyimide fluoride or the like. In particular, the fluorine-based resin film is expected as a material to achieve the low dielectric constant. Such organic materials are preferably used since a further lower dielectric constant can be achieved by means of molecular design, and it can be easily deposited by spin coating.

On the other hand, as a high-dielectric constant (high-k) material, there is tantalum oxide, hafnium oxide ($HfO_2$), hafnium silicon oxynitride (HfSiON), zirconium oxide ($ZrO_2$), aluminum oxide ($Al_2O_3$), titanium oxide ($TiO_2$) or the like.

Alternatively, the withstand voltage may be varied between the first memory material layer and the second memory material layer instead of varying the dielectric constant. For example, the first memory material layer to be destroyed first is formed to have a lower withstand voltage than the second memory material layer. This is because a layer having a lower withstand voltage is easily destroyed first given that each layer has about the same dielectric constant.

Needless to say, both the dielectric constant and the withstand voltage may be varied between the first memory material layer and the second memory material layer.

In addition, the thickness (d1) of the first memory material layer may be varied from the thickness (d2) of the second memory material layer. For example, a thicker memory material layer between the first and second memory material layers is formed to be 1.1 to 5 times thicker than the other. Note that in the case of using an inorganic material, the memory material layer is often destroyed due to generation of a dielectric breakdown; therefore, in order to generate a dielectric breakdown, the first and second memory material layers are each formed to have a thickness of 5 to 500 mn, or preferably 10 to 100 nm. In this manner, when thin memory material layers are used, voltage applied to destroy the layers can be low.

In this embodiment mode, the first memory material layer is preferably formed thinner than the second memory material layer in order to destroy the first memory material layer by applying a first voltage. Further, the second memory material layer is preferably formed thicker than the first memory material layer in order that the second memory material layer is not destroyed upon applying the first voltage.

On the other hand, description is made below on a case of using an organic material for the memory material layers. In the case of using an organic material, the material becomes fluid when it is heated to over the glass-transition temperature. As a result, the memory material layers can be destroyed sequentially by varying the glass glass-transition temperatures between each layer.

Specifically, in order to soften or melt the first memory material layer 104 by applying a first voltage, the glass-transition temperature (T1) of the first memory material layer 104 is set lower than the glass-transition temperature (T2) of the second memory material layer 105. At this time, it is preferable to provide a difference of 10° C. or more between the glass-transition temperature (T1) of the first memory material layer 104 and the glass-transition temperature (T2) of the second memory material layer 105. By providing a difference of 10° C. or higher in glass-transition temperature, the memory material layers can be sequentially destroyed.

As such organic materials, for example, there are 1,3,5-tris [N,N-di(m-tolyl)amino]benzene (abbreviated to m-MTDAB); 4,4-bis(2,2 diphenylvinyl)biphenyl (abbreviated to DPVBi); 4,4',4"-tris[N-(3-methylphenyl)-N-phenylamino]triphenylamine (abbreviated to m-MTDADA); 4,4'-bis[N-(1-naphthyl)-N-phenylamino]biphenyl (abbreviated to NPB); 4,4'-bis[N-(4-diphenylaminophenyl)]-N-phenylamino]biphenyl (abbreviated to DPAB); 4,4'-bis[N-(9,9-dimethylfluorene-2-yl)-N-phenylamino]biphenyl (abbreviated to DFLDPBi); and 4,4'-4"-tris(N-carbazolyl) triphenylamine (abbreviated to TCTA). The glass-transition temperatures of such organic materials are as follows: m-MTDAB: 50° C. (observed value), DPVBi: 63° C. (observed value), m-MTDATA: 78° C. (observed value), NPB: 98° C. (observed value), DPAB: 112° C. (observed value), DFLDPBi: 124° C. (observed value), and TCTA: 151° C. (value in the document). Among such organic materials, a combination of materials may be selected to satisfy a difference of 10° C. or more in glass-transition temperature. For example, m-MTDAB may be used for the first memory material layer, and NPB may be used for the second memory material layer. Alternatively, NPB may be used for the first memory material layer, and TCTA may be used for the second memory material layer. Note that the invention is not limited to the aforementioned materials as long as a combination of organic materials is adopted to satisfy a difference of 10° C. or more in glass transition temperature.

When a voltage is applied to the top electrode 102 and the bottom electrode 101, the first memory material layer that has a low glass-transition temperature is softened or melted to be destroyed, thereby the bottom electrode is short-circuited to the second memory material layer. Further at this time, if the aforementioned thickness range is satisfied, a dielectric breakdown occurs. In this manner, the memory material layers can be destroyed by generating any or all of a dielectric breakdown, softening and melting That is, as a result of applying the first voltage to the top electrode 102 and the bottom electrode 101, the first memory material layer 104 is destroyed to cause a short circuit between the bottom electrode 101 and the second memory material layer 105, and subsequently, as a result of applying a second voltage, the second memory material layer is destroyed to cause a short circuit between the bottom electrode 101 and the top electrode 102, the destructions of which may be caused by a dielectric breakdown, softening and melting. At this time, the second voltage is set higher than the first voltage.

The material of each memory material layer is not specifically limited as long as the condition for sequentially destroying the memory material layers is satisfied. For example, a memory element having stacked layers of an organic material and an inorganic material may be used. The structure of such memory material layers is described in the following embodiment modes.

Figure 2:
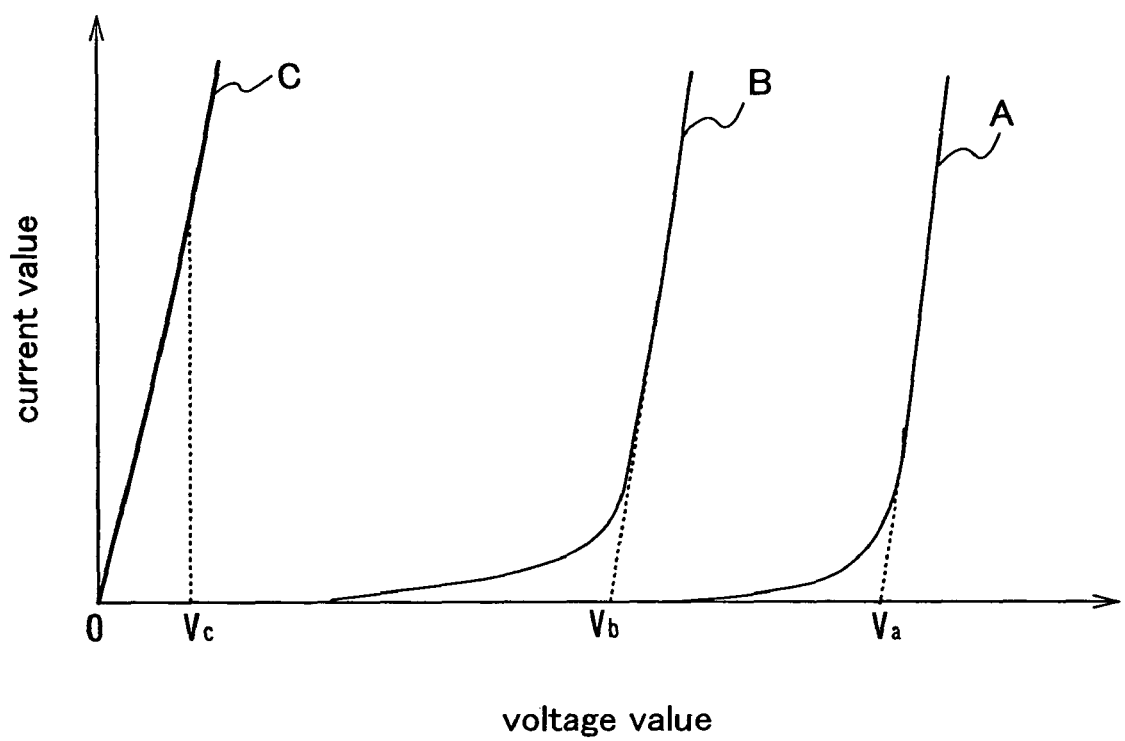
FIG. 2 shows the voltage-current characteristics of a memory element of the invention.

FIG. 2 shows voltage-current characteristics (A), (B) and (C) of the memory element shown in FIG. 1A. Note that each memory material layer is formed by using an organic material.

The voltage-current characteristic (A) of the memory element shows an initial state (referred to as a first state) in which neither of the first memory material layer nor the second memory material layer is destroyed. The voltage-current characteristic (B) of the memory element shows a second state in which the first memory material layer is destroyed. Note that the second state corresponds to a state in which the bottom electrode 101 and the second memory material layer 105 are short-circuited. The voltage-current characteristic (C) of the memory element shows a third state in which the first and second memory material layers are destroyed. Note that the third state corresponds to a state in which the bottom electrode 101 and the top electrode 102 are short-circuited.

In the first state, current does not flow into the memory element having the first and second material layers unless a predetermined voltage (Va) or higher is applied thereto. Note that the voltage Va is the threshold voltage of the voltage-current characteristic (A) of the memory element having a stacked-layer structure. In the second state, the first memory material layer 104 is destroyed; therefore, the memory element has the same condition as a memory element having only the second memory material layer 105. Current flows into such a memory element by applying a predetermined voltage (Vb, where Vb<Va) or higher. Note that the voltage Vb is the threshold voltage of the voltage-current characteristic (B) of the memory element. In the third state, the bottom electrode 101 and the top electrode 102 are short-circuited; therefore, current flows into the memory element only by applying a low voltage (Vc, where Vc<Vb<Va). That is, the bottom electrode 101 and the second memory material layer 105 are short-circuited in the third state.

Note that the voltage values Va and Vb may be controlled in accordance with the thickness of the first memory material layer 104 and the second memory material layer 105. For example, as the first memory material layer 104 is formed to be thinner, the voltage value (Va) in the second state can be lower, and as the second memory material layer 105 is formed to be thinner, the voltage value (Vb) in the second state can be lower. In addition, the second memory material layer 105 is preferably formed thicker than the first memory material layer 104 so that the second memory material layer 105 is not destroyed upon applying a voltage for destroying the first memory material layer 104.

Through the first to third states, data composed of three values can be written into the memory element. As a result, a memory capacity of the memory device can be increased.

Figure 1B:
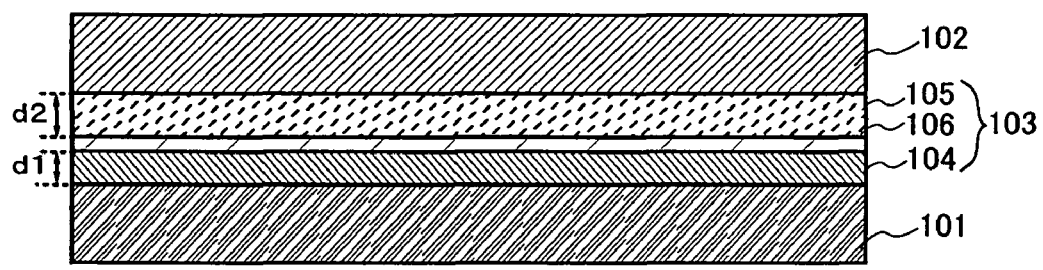

FIG. 1B shows a mode where a layer 106 is provided between the first memory material layer 104 and the second memory material layer 105 in the memory element shown in FIG. 1A. The layer 106 is provided in the form of a film or a cluster. This is because the state of the layer 106 differs depending on the material or the formation method of the layer 106. For example, the layer 106 may be provided in the form of a cluster when it is formed extremely thin. The layer 106 may be formed by using an organic-inorganic composite material, a heat-generating material or a conductive material.

As an organic-inorganic composite material, in the case of forming the memory material layers by using organic materials, the layer 106 may be formed by using a mixed material of an inorganic material and the same organic material as that of the memory material layers. As an inorganic material, for example, a metal oxide may be used. In the case of using a mixed layer of a metal oxide and an organic compound, that is an organic-inorganic composite material, a voltage applied between the both electrodes is not required to be increased even if the layer 106 is formed thicker. By forming the layer 106 thick, defects that would occur in deposition of the memory material layers can be prevented.

Specifically, in the case where the organic materials for forming the memory material layers have a high hole transporting property, the metal oxide is preferably a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

Alternatively, in the case where the organic materials for forming the memory material layers have a high electron transporting property, the metal oxide is preferably a lithium oxide, a calcium oxide, a sodium oxide, a potassium oxide or a magnesium oxide.

Alternatively, the layer 106 may be formed by using a heat-generating material or a highly conductive material. By providing a heat-generating material, the memory material layer to be destroyed first, which is formed of an organic material, can be positively softened or melted.

In addition, the invention is not limited to the structure where the layer 106 is provided between the first and second memory material layers, but the layer 106 may be provided between the top electrode 102 and the memory material layer 103 or between the bottom electrode 101 and the memory material layer 103. In particular, in the case of destroying the first memory material layer 104 by a first voltage, it is preferable to provide a heat-generating material or the like as the layer 106 between the top electrode 102 and the first memory material layer 104. This is because the first memory material layer 104 can be quickly and easily softened or melted to be destroyed.

Although this embodiment mode illustrates the case where the memory material layers are destroyed in order from the bottom electrode side, the invention is not limited to this. That is, the invention has one feature of sequentially destroying the stacked memory material layers and reading the state of each memory material layer by applying a voltage. Thus, the memory material layer on the top electrode side may be destroyed first as long as the aforementioned effect can be accomplished.

[Embodiment Mode 2]

In this embodiment mode, description is made on a structure where three memory material layers are provided, by applying the element structure shown in the aforementioned embodiment mode.

Figure 3A:
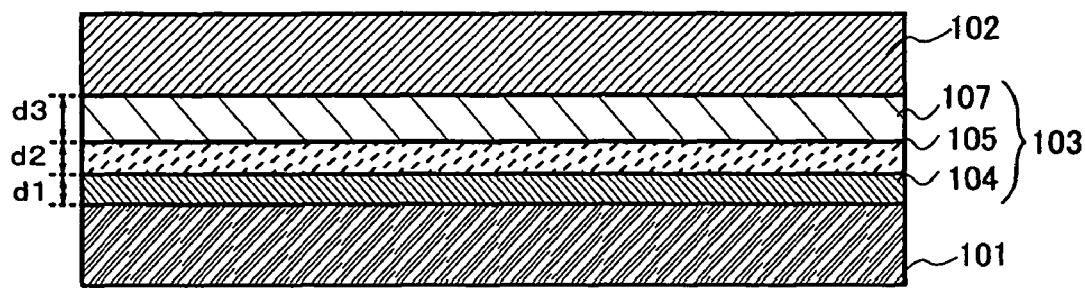
FIGS. 3A to 3C are cross-sectional views of memory elements of the invention.

In FIG. 3A, the first memory material layer 104, the second memory material layer 105 and a third memory material layer 107 are sequentially stacked as the memory material layer 103 between the top electrode 102 and the bottom electrode 101. Each memory material layer may be formed by using an organic material or an inorganic material as in the aforementioned embodiment mode.

In the case of using inorganic materials for the memory material layers as in the aforementioned embodiment mode, the dielectric constants of the first to third memory material layers are varied from each other. For example, the first memory material layer 104 to be destroyed first is formed to have a lower dielectric constant than the second memory material layer 105. Similarly, the second memory material layer 105 is formed to have a lower dielectric constant than the third memory material layer 107. This is because the memory material layers are likely to be destroyed in the order of descending dielectric constants. By reading a difference in resistance values in a graph showing the voltage-current characteristics between before and after the first and second memory material layers are destroyed, multivalued data can be written into the memory element.

Alternatively, the withstand voltage of each memory material layer may be varied instead of varying the dielectric constant. In this case, the first memory material layer 104 to be destroyed first is formed to have a lower withstand voltage than the second memory material layer 105. Similarly, the second memory material layer 105 is formed to have a lower withstand voltage than the third memory material layer 107. This is because the memory material layers are likely to be destroyed in the order of descending withstand voltages.

In addition, the thickness (d1) of the first memory material layer 104, the thickness (d2) of the second memory material layer 105, and the thickness (d3) of the third memory material layer 107 may be varied from each other. For example, in the case of destroying the memory material layers in order from the first to third memory material layers, the first memory material layer 104 is formed to be thinnest as in the aforementioned embodiment mode. That is, the thickness of each memory material layer satisfies d1<d2<d3. In addition, each of the first to third memory material layers is formed to have a thickness of 5 to 500 nm, or preferably 10 to 100 nm. By using thin memory material layers in this manner, a voltage applied to destroy each memory material layer can be set low. In addition, a thicker memory material layer between two memory material layers is formed to be 1.1 to 5 times thicker than the other. That is, the second memory material layer is formed to be 1.1 to 5 times thicker than the first memory material layer, or the third memory material layer is formed to be 1.1 to 5 times thicker than the second memory material layer.

Meanwhile, in the case of using organic materials for the memory material layers as in the aforementioned embodiment mode, the glass-transition temperature of each memory material layer is varied, and the first memory material layer 104 to be destroyed first is formed to have the lowest glass-transition temperature. That is, the glass-transition temperatures (T1 to T3) of the respective memory material layers are set to satisfy T1<T2<T3. At this time, the difference between T1 and T2 and the difference between T2 and T3 are each set to be 10° C. or more.

Note that the first to third memory material layers are not required to be formed by using different materials, and only two kinds of memory material layers may be provided. In this case, a three-layer structure may be formed by forming a different memory material layer interposed between two identical memory material layers. Note that since one of the two identical memory material layers is required to be destroyed first, a heat-generating material or the like is used.

In such a memory element, the memory material layers are destroyed in order from the first memory material layer by applying a voltage to the top electrode 102 and the bottom electrode 101. As shown in the aforementioned embodiment mode, the memory material layers may be destroyed by either or both of a dielectric breakdown, and softening or melting that occurs in reaching the glass-transition temperature or higher.

That is, a first voltage may be applied to destroy the first memory material layer 104, thereby short-circuiting the bottom electrode layer 101 and the second memory material layer 105; a second voltage may be applied to destroy the second memory material layer 105, thereby short-circuiting the bottom electrode 101 and the third memory material layer 107; and a third voltage may be applied to destroy the third memory material layer 107, thereby short-circuiting the bottom electrode 101 and the top electrode 102.

Figure 4:
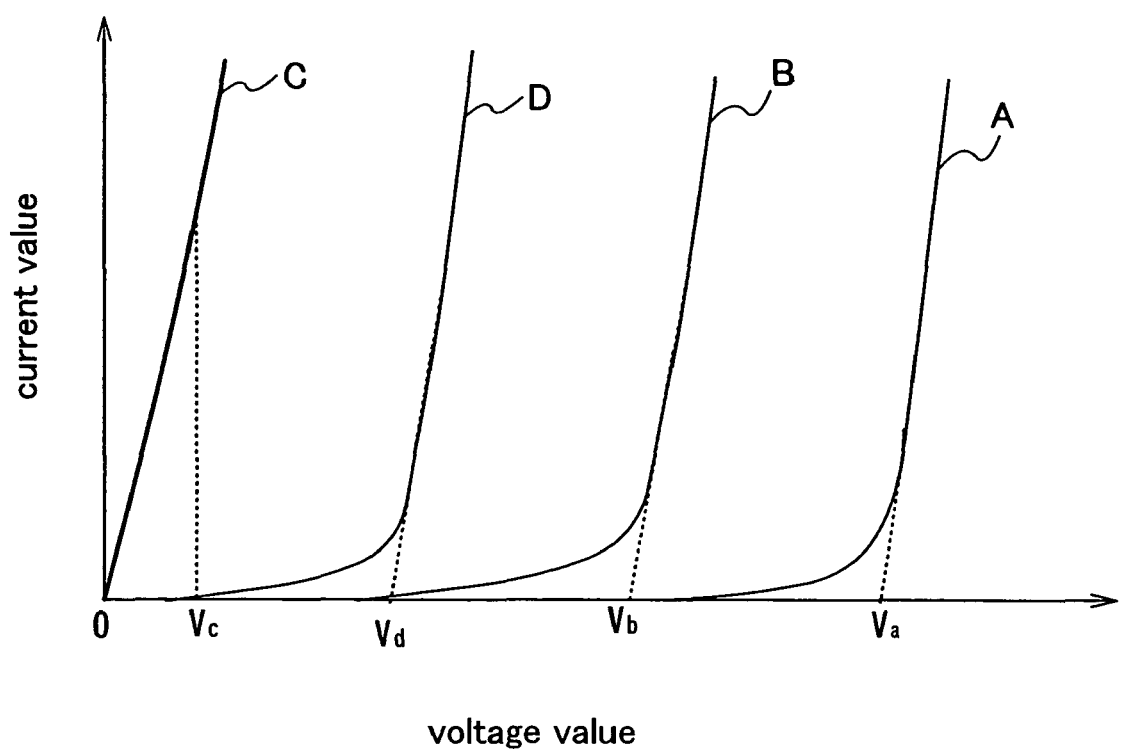
FIG. 4 shows the voltage-current characteristics of a memory element of the invention.

FIG. 4 shows a voltage-current characteristic (D) of the memory element in addition to the voltage-current characteristics (A), (B) and (C) of the memory element shown in FIG. 2. Each memory material layer is formed by using an organic material as in the aforementioned embodiment mode. The first to third states are similar to those in FIG. 2. The voltage-current characteristic (D) of the memory element shows a fourth state in which the first and second memory material layers are destroyed. Note that the fourth state corresponds to a state in which the bottom electrode 101 and the third memory material layer 105 are short-circuited.

In the fourth state, current flows into the memory element when a constant voltage (Vd, where Vd<Vb<Va and Vd>Vc) is applied. Note that the voltage Vd is the threshold voltage of the voltage-current characteristic (D) of the memory element.

By stacking three memory material layers in this manner, data composed of four values can be written into the memory element. That is, by increasing the number of stacked memory material layers, multivalued data can be written into the memory element. Needless to say, a memory element having more than three memory material layers may be provided in the invention.

Figure 3B:
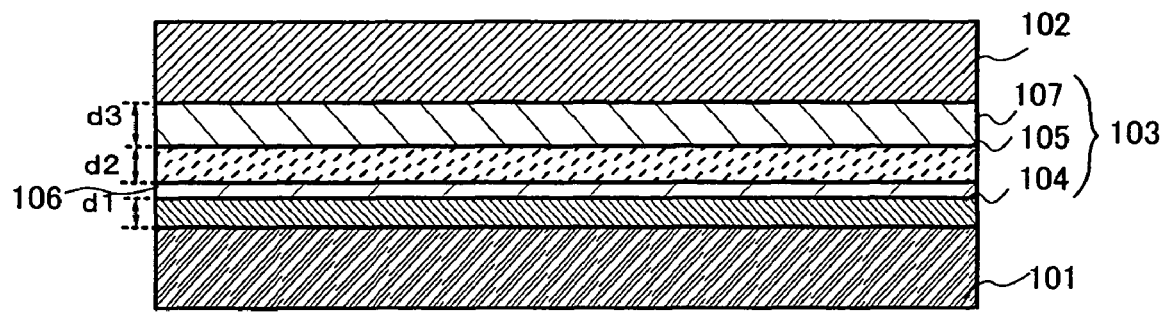

FIG. 3B shows a mode in which the layer 106 is provided between the first memory material layer 104 and the second memory material layer 105 of the memory element shown in FIG. 3A.

Figure 3C:
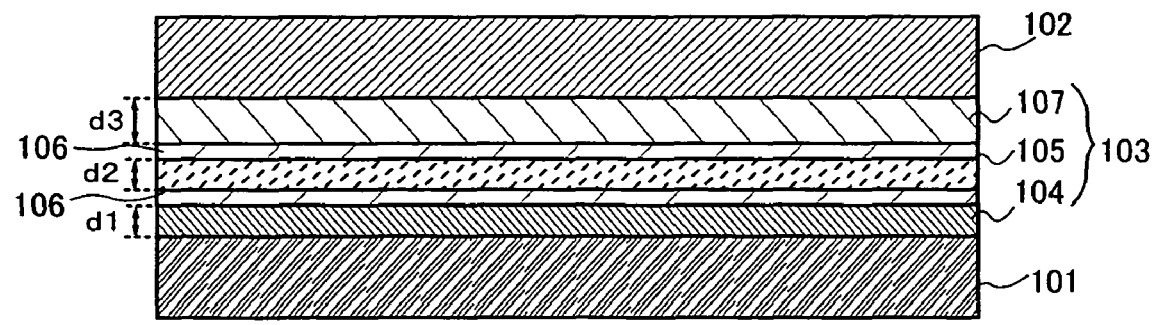

Further, FIG. 3C shows a mode where another layer 106 is provided between the second memory material layer 105 and the third memory material layer 107 in addition to the layer 106 in FIG. 3B. Note that in the case of providing the multiple layers 106, they are not required to be the identical layers, each of the layers 106 may be formed of a different material.

For the material and the manufacturing method of the layers 106, the aforementioned embodiment mode may be referred to.

Although this embodiment mode shows the case where the memory material layers are destroyed in order from the bottom electrode side, the invention is not limited to this. That is, the invention has one feature of sequentially destroying the stacked memory material layers and reading the state of each memory material layer by applying a voltage, where either of the memory material layer on the top electrode side or the middle memory material layer may be destroyed first as long as the aforementioned effect can be accomplished.

[Embodiment Mode 3]

In the invention, the state of one memory material layer may be changed by applying a first voltage between opposite electrodes, while the state of the other memory material layer may be changed by applying a second voltage therebetween. In addition, the voltage-current characteristic may reflect changes in the state of the memory material layers, so that a difference in voltage can be read. The material of each memory material layer is not specifically limited as long as the aforementioned conditions are satisfied. Here, description is made on a memory element where an organic material and an inorganic material are stacked.

Figure 15:
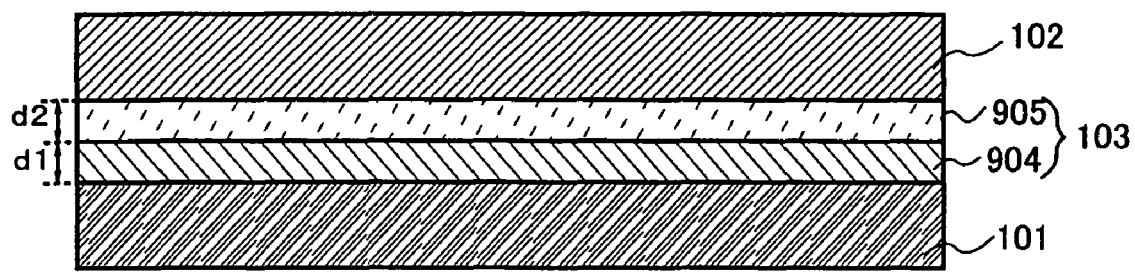
FIG. 15 is a cross-sectional view of a memory element of the invention.

In such a memory element having a stack of an organic material and an inorganic material, the inorganic material is required to be destroyed first; therefore, as shown in FIG. 15, an inorganic material is used for a first memory material layer 904 while an organic material is used for a second memory material layer 905. Description on other structures that are similar to those in FIG. 1 is omitted.

The state of such a memory element is described with reference to the voltage-current characteristics of the memory element shown in FIG. 16.

Figure 16:
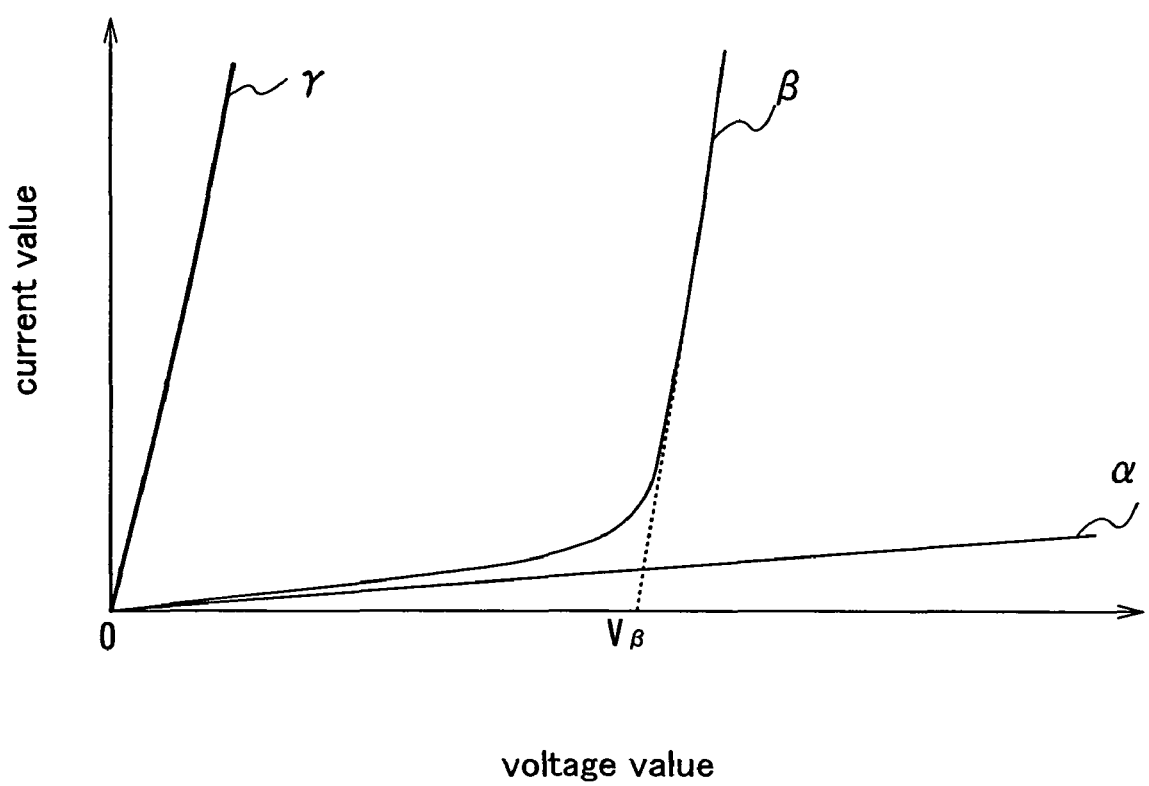
FIG. 16 shows the voltage-current characteristics of a memory element of the invention.

Since an inorganic material is stacked, the memory element shows a voltage-current characteristic as shown by (a) in FIG. 16. This insulation state is called a first state.

After that, when the inorganic material is destroyed, it can be considered that the memory element has a structure where only an organic material is sandwiched. Then, the memory element shows a voltage-current characteristic that has a threshold value (β). The threshold voltage at this time is called Vβ. The state showing such diode characteristic is called a second state.

Further, when the organic material is destroyed, the memory element shows a characteristic (γ) in which the bottom electrode 101 and the top electrode 102 are short-circuited. This state is called a third state.

In such a memory element, three different states can be obtained starting from an insulation state, by sequentially destroying the memory material layer formed of an inorganic material and destroying the memory material layer formed of an organic material. By using such states, data composed of three values can be written into the memory element.

Note that in this embodiment mode, the thickness of each memory material layer may be varied.

In addition, in this embodiment mode also, the layer 106 may be provided between each memory material layer or between the memory material layer and the electrode. The aforementioned embodiment mode may be referred to for the details of the layer 106.

In this manner, multivalued data can be written into the memory element by using the memory material layers in which an inorganic material and an organic material are stacked.

[Embodiemtn Mode 4]

In this embodiment mode, description is made on a method for forming a memory element over a glass substrate as an insulating substrate. Note that shown here is a mode where a circuit for controlling the memory element (control circuit) is formed over the same substrate as the memory element.

Figure 5A:
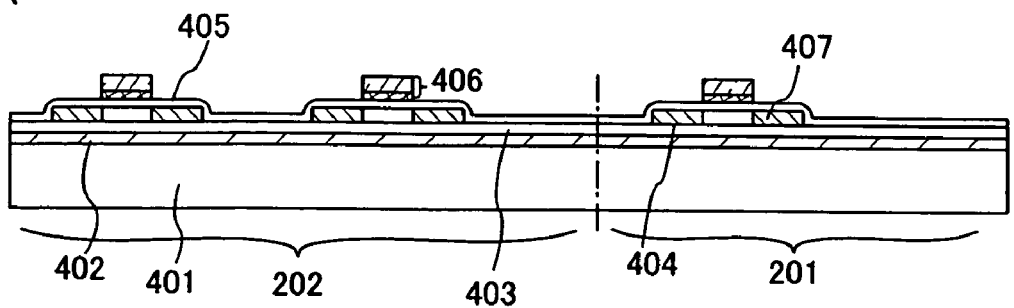
FIGS. 5A to 5D illustrate manufacturing steps of a memory element of the invention.

First, as shown in FIG 5A, a separation layer 402 is formed over a glass substrate 401. The insulating substrate may be formed by using quartz, silicon, metal or the like as well as glass. The separation layer 402 is obtained by entirely or selectively forming a film containing metal or a film containing silicon over the substrate. By at least selectively forming the separation layer 402, it can be peeled off the glass substrate 401 later. As a material for the metal, an element selected from among W, Ti, Ta, Mo, Nd, Ni, Co, Zr, Zn, Ru, Rh, Pd, Os or Ir, or an alloy material or compound material containing such metals as a main component may be used in a single layer or multiple layers. As the compound material, oxide or nitride of such metal may be used. In addition, the state of a film containing silicon may be any of a crystalline state, an amorphous state and a microcrystalline state. The speed for removing the separation layer 402 can be controlled in accordance with the state.

Next, an insulating layer 403 is formed to cover the separation layer 402. The insulating layer 403 is formed of silicon oxide, silicon nitride or the like. Then, a semiconductor layer is formed over the insulating layer 403, and the semiconductor layer is crystallized by laser crystallization, thermal crystallization using metal elements or the like, and then patterned into a predetermined shape to form an island-like semiconductor layer 404. The laser crystallization may be performed by using either of a continuous wave laser or a pulsed laser. As the laser, one or more of the following may be used: an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser. For example, a pulsed excimer laser may be used. The semiconductor layer 404 is formed to have a thickness of 0.2 μm or less, typically 40 to 170 nm, or preferably 50 to 150 nm. Note that the semiconductor layer may be formed by using any of an amorphous semiconductor, a microcrystalline semiconductor, an organic semiconductor and the like as well as a crystalline semiconductor. In addition, the semiconductor layer may be formed by using a material containing silicon, for example by using a mixed material of silicon and germanium.

Next, a gate insulating layer 405 is formed to cover the semiconductor layer 404. The gate insulating layer 405 is formed by using silicon oxide, silicon nitride or the like. Such gate insulating layer 405 may be formed by CVD, thermal oxidation or the like. Alternatively, after continuously forming the semiconductor layer 404 and the gate insulating layer 405 by CVD, the layers can be patterned at the same time. In this case, contamination of the boundary between each layer due to impurities can be suppressed.

Then, a gate electrode layer 406 is formed. The gate electrode layer 406 is formed by using an element selected from among tantalum (Ta), tungsten (W), titanium (Ti), molybdenum (Mo), aluminum (Al) or copper (C), or an alloy or compound material containing such elements as a main component, and patterning it into a desired shape. In the case of patterning by photolithography, the width of the gate electrode can be thinned by using a resist mask of which width is thinned by plasma etching or the like. Accordingly, the performance of a transistor can be enhanced. The gate electrode layer 406 may have either a single-layer structure or a stacked-layer structure. FIG 5A shows a case where the gate electrode layer 406 has a stacked-layer structure.

Next, impurity elements are added into the semiconductor layer 404 to form an impurity region 407. The impurity region 467 is obtained through photolithography by forming a resist mask and then adding impurity elements such as phosphorus, arsenic or boron. With the impurity elements, polarity of either an n-channel type or a p-channel type can be determined.

Figure 5B:
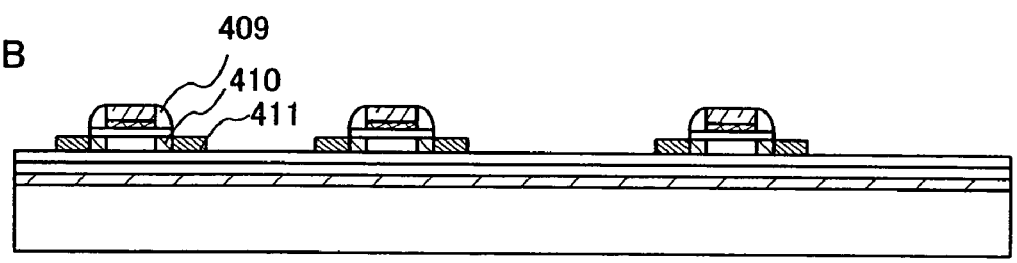

Then, as shown in FIG 5B, an insulator containing silicon, such as an insulating layer containing silicon nitride or the like is formed, and the insulating layer is anisotropically (perpendicularly) etched to form an insulating layer (referred to as a sidewall) 409 which contacts with a side face of the gate electrode. In forming the sidewall, the gate insulating layer 405 might be etched.

Then, impurities are further added into the semiconductor layer 404 to form a first impurity region 410 right under the sidewall 409 and a second impurity region 411 having a higher concentration of impurities than the first impurity region 410. The structure having such impurity regions is called an LDD (Lightly Doped Drain) structure. If the first impurity region 410 overlaps the gate electrode layer 406, the structure is called a GOLD (Gate-drain Overlapped LDD) structure.

Figure 5C:
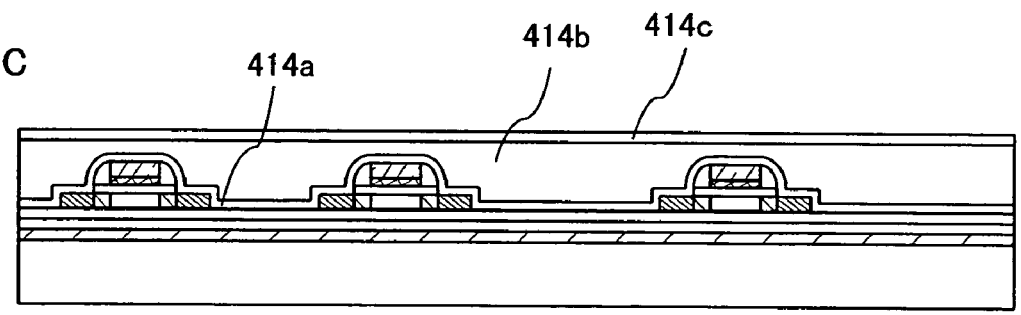

Then, as shown in FIG. 5C, an insulating layer 414 is formed to cover the semiconductor layer 404 and the gate electrode layer 406. The insulating layer 414 is formed by using an inorganic material, an organic material or the like which has an insulating property. As an inorganic material having an insulating property, there is silicon oxide, silicon nitride or the like. Meanwhile, as an organic material having an insulating property, there is polyimide, acrylic, polyamide, polyimide amide, resist, benzocyclobutene, siloxane or polysilazane. Siloxane is a resin having a bond of silicon (Si) and oxygen (O), which has a skeleton formed by the bond of silicon (Si) and oxygen (O). As a substituent of the siloxane, an organic group containing at least hydrogen (e.g., an alkyl group or aromatic hydrocarbon) is used. Alternatively, a fluoro group may be used as the substituent. Further alternatively, both a fluoro group and an organic group containing at least hydrogen may be used as the substituent. As for polysilazane, it is formed by using a polymer material having the bond of silicon (Si) and nitrogen (Ni) as a starting material.

FIG. 5C shows a mode where the insulating layer 414 is formed to have a stacked-layer structure, and a first insulating layer 414a, a second insulating layer 414b and a third insulating layer 414c are formed in this order from the bottom side. The first insulating layer 414a is preferably formed by plasma CVD so as to contain much hydrogen since dangling bonds of the semiconductor layer 404 can be reduced by hydrogen. The second insulating layer 414b is preferably formed by using an organic material, which would increase the planarity. The third insulating layer 414c is preferably formed by using an inorganic material in order to prevent discharge of moisture or the like from the second insulating layer 414b formed of an organic material or to prevent intrusion of moisture through the second insulating layer 414b.

Figure 5D:
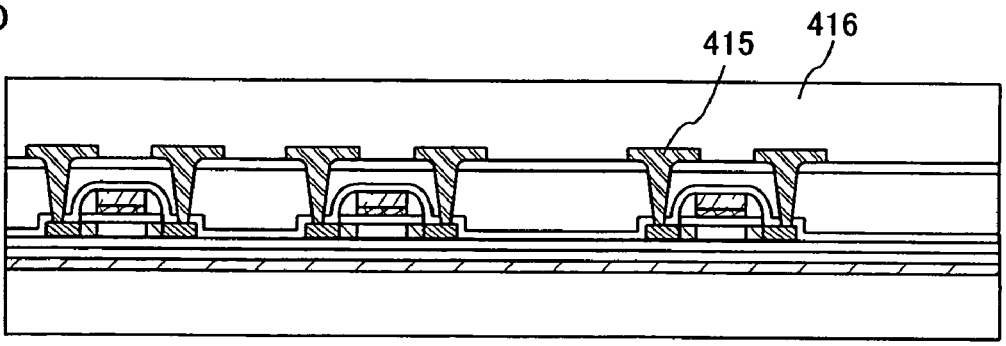

Then, a contact hole is formed to expose the second impurity region 411, and a conductive layer 415 is formed to fill the contact hole as shown in FIG 5D. The conductive layer 415 corresponds to a film formed of an element selected from among aluminum (Al), titanium (Ti), molybdenum (Mo), tungsten (W) or silicon (Si), or an alloy film containing such elements. In addition, the conductive layer 415 can be formed to have a single-layer structure or a stacked-layer structure. After that, the conductive layer 415 is patterned into a desired shape, thereby forming source electrodes, drain electrodes and other electrodes at the same time.

In order to lower the contact resistance between the source and drain electrodes and the second impurity region 411, a silicide may be formed on the impurity region. For example, after forming a film containing a metal element (typically, Ni) on the second impurity region 411, the film is heated by thermal annealing using an annealing furnace, laser annealing, or rapid thermal annealing (RTA). As a result, a silicide containing the metal element and silicon is formed on the second impurity region, and thus the on current and mobility can be expected to be increased.

In this manner, thin film transistors are completed in a control circuit portion 202 and a memory element region 201. In the control circuit portion 202, a circuit is formed by using the thin film transistors.

Next, an insulating layer 416 is formed to cover the conductive layer 415. The insulating layer 416 may be formed by using an inorganic material, an organic material or the like having an insulating property, and may be formed in either a single layer or stacked layers. A similar inorganic material or organic material to that of the insulating layer 414 may be used.

Figure 6A:
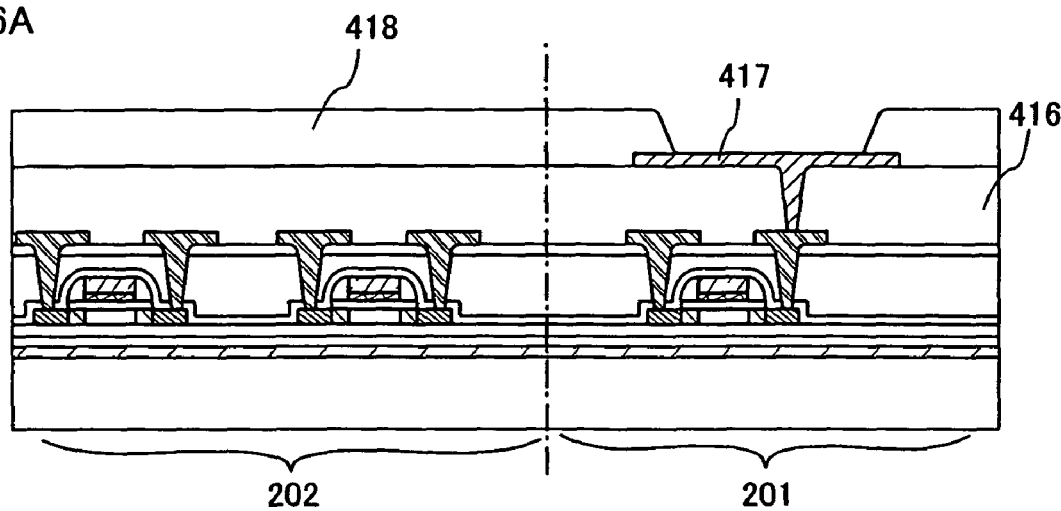
FIGS. 6A and 6B illustrate manufacturing steps of a memory element of the invention.

Then, as shown in FIG. 6A, a contact hole is formed in the insulating layer 416 so as to expose the conductive layer 415, and a conductive layer 417 is formed to fill the contact hole. The conductive layer 417 may be formed to have either of a single-layer structure or a stacked-layer structure. The conductive layer 417 corresponds to a film formed of an element selected from among aluminum (Al), titanium (Ti), molybdenum (Mo), tungsten (W) or silicon (Si), or an alloy film containing such elements. Alternatively, the conductive layer 417 may be formed by using a light-transmissive material such as indium tin oxide (ITO), indium tin oxide containing silicon oxide (ITSO) or indium oxide containing 2 to 20% of zinc oxide. After that, the conductive layer 417 is patterned into a desired shape. The patterned conductive layer 417 can function as a bottom electrode of a memory element.

Although this embodiment mode illustrates the case where the bottom electrode of the memory element is formed of the conductive layer 417, it may be formed of the conductive layer 415. That is, the conductive layer 415 to be a source electrode or a drain electrode of a thin film transistor may be used in common as the bottom electrode of the memory element.

An insulating layer is formed to cover the patterned conductive layer 417, thereby forming an insulating layer (also referred to as a partition wall or a bank) 418 that is provided with an opening so as to expose the conductive layer 417 while covering edges of the conductive layer 417. The bank 418 may be formed by using an organic material, an inorganic material or the like. For example, a similar inorganic material or organic material to that of the insulating layer 414 may be used. A side face of the opening of the bank 418 is preferably tapered, which can prevent breaking of a thin film to be formed later.

Figure 6B:
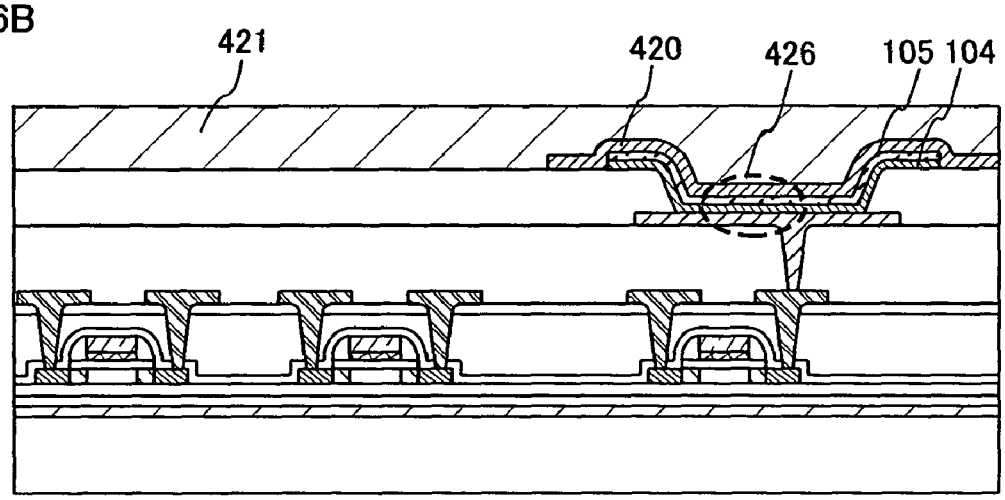

Next, as shown in FIG. 6B, the memory material layer 103 is formed in an opening of the bank 418. In this embodiment mode, the first memory material layer 104 and the second memory material layer 105 are formed. The memory material layer 103 may be formed by vapor deposition, spin coating or a droplet discharge method typified by ink-jet deposition. In the case of using an inorganic material as in the aforementioned embodiment mode, the first memory material layer 104 is formed thicker than the second memory material layer 105, and yet the first memory material layer 104 is formed to have a higher dielectric constant than the second memory material layer 105. Meanwhile, in the case of using an organic material, the first memory material layer 104 is formed to have a lower glass-transition temperature than the second memory material layer 105. For other structures of the memory element, the aforementioned embodiment mode may be referred to. In addition, any of the memory elements shown in the aforementioned embodiment modes may be used in this embodiment mode.

In addition, since the memory material layer 103 can be formed by using the same material as an electroluminescent layer of the light-emitting element, the memory element and the light-emitting element can be formed over the same substrate. That is, a memory device having a display function can be formed.

Subsequently, a conductive layer is formed as a counter electrode 420. Since the counter electrode 420 can be formed over the entire surface of the memory element region, patterning by photolithography is not required. Needless to say, the counter electrode 420 may be formed selectively by patterning. The counter electrode 420 can function as a top electrode of the memory element.

Thus, a memory element 426 having the conductive layer 417, the first memory material layer 104, the second memory material layer 105 and the counter electrode 420 is formed.

More preferably, an insulating layer 421 to function as a protective film is formed. In order to increase the shock resistance, the insulating layer 421 is preferably formed thick. Therefore, the insulating layer 421 is preferably formed by using an organic material such as an epoxy resin or a polyimide resin. In addition, a drying agent is preferably dispersed in the insulating layer 421 in order to provide a hygroscopic property. This is because intrusion of moisture can be prevented in the case of forming the memory material layers by using an organic material, in particular. By sealing with the insulating layer 421 in this manner, intrusion of moisture as well as unnecessary oxygen can be prevented.

In this manner, a circuit having thin film transistors that are provided in the control circuit portion 202 can be formed, as well as the memory element 426 that is provided in the memory element region 201 while being formed over the same substrate as the circuit, and a thin film transistor connected to the memory element 426. The memory element is controlled by the thin film transistor. In this manner, a memory element to which a thin film transistor is connected is called an active memory element.

In the memory device of the invention, the memory element 426 and the control circuit can be formed over the same substrate; therefore, the manufacturing cost can be reduced. Further, since a step of mounting a memory element formed in a conventional IC is not required, connection defects with the control circuit can be prevented.

Figure 7:
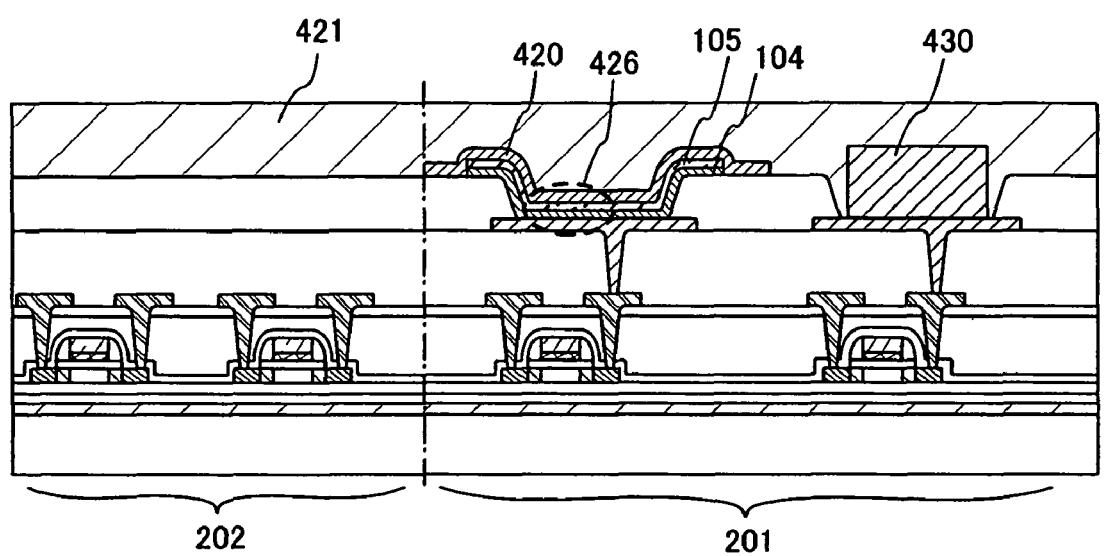
FIG. 7 illustrates a manufacturing step of a memory element of the invention.

FIG. 7 shows a mode where an antenna 430 for supplying power or the like to the memory element 426 is provided. This embodiment mode illustrates a mode where the antenna 430 is formed in an opening provided in the bank.

The antenna 430 may be formed to be connected to a thin film transistor provided in the memory element region 201, and is formed by using a conductive material, preferably a low-resistance material such as Cu (copper), Ag (silver) or Al (aluminum). Further, the antenna 430 is preferably formed thick in order to lower the resistance thereof. Such antenna 430 may be formed by vapor deposition, printing, plating, or a droplet discharge method typified by ink-jet deposition.

By incorporating the antenna 430 into the memory device in this manner, wireless communication with a reader/writer device can be carried out. As a result, multivalued data can be written into the memory element 426 without breakdown.

Figure 8A:
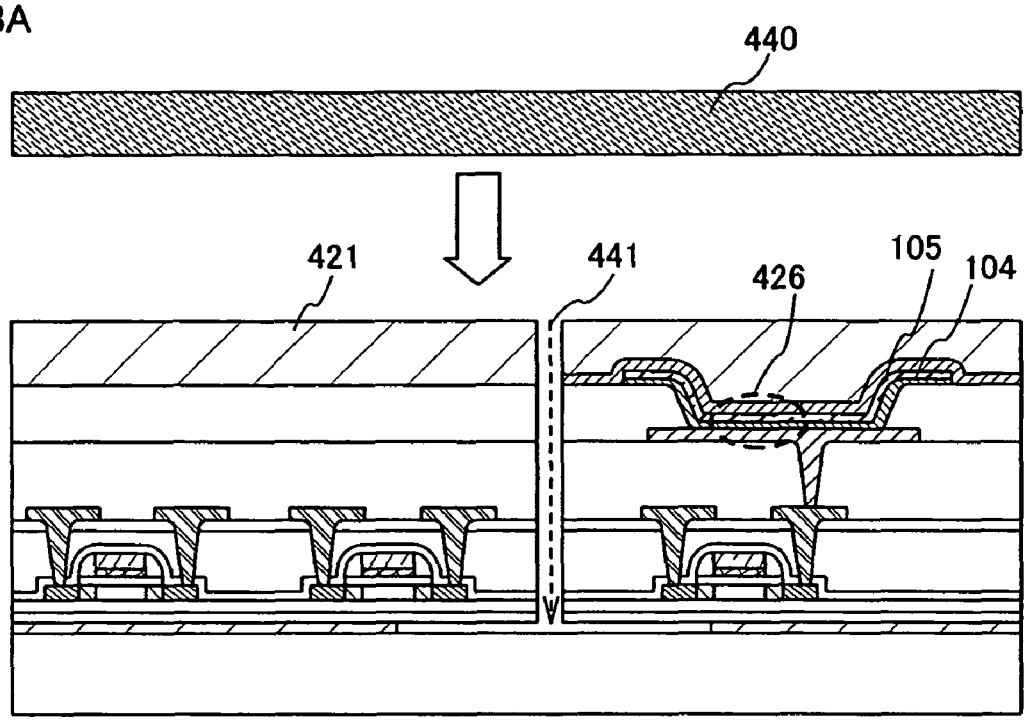
FIGS. 8A and 8B illustrate manufacturing steps of a memory element of the invention.

Although a memory device can be completed through the aforementioned steps, a groove may be formed thereafter as shown in FIG. 8A, and an etchant 441 may be introduced into the groove so that the memory device can be peeled off the glass substrate 401. At this time, a resin substrate 440 attached onto the insulating layer 421 is preferably used as a supporting base in order to easily peel off the glass substrate 401. Note that the resin substrate 440 may be attached by using an adhesion function of the insulating layer 421. The resin substrate 440 may be formed by using plastic typified by polyethylene terephthalate (PET), polyethylene naphthalate (PEN) or polyethersulfone (PES), or a synthetic resin such as acrylic. Since such a resin substrate is quite thin, it has a film form. Therefore, the memory device can be peeled off the glass substrate 401 by attaching the rolled up resin substrate 440 onto the insulating layer 421. Such a step is suitable for mass production.

The etchant 441 is not specifically limited to a certain type as long as the peeling layer 402 can be selectively etched. For example, a halide compound may be used. In the case of using amorphous silicon or tungsten for the peeling layer, $ClF_3$ (chlorine trifluoride) may be used as the etchant. In addition, in the case of using silicon oxide for the peeling layer, HF (hydrogen fluoride) may be used as the etchant.

Figure 8B:
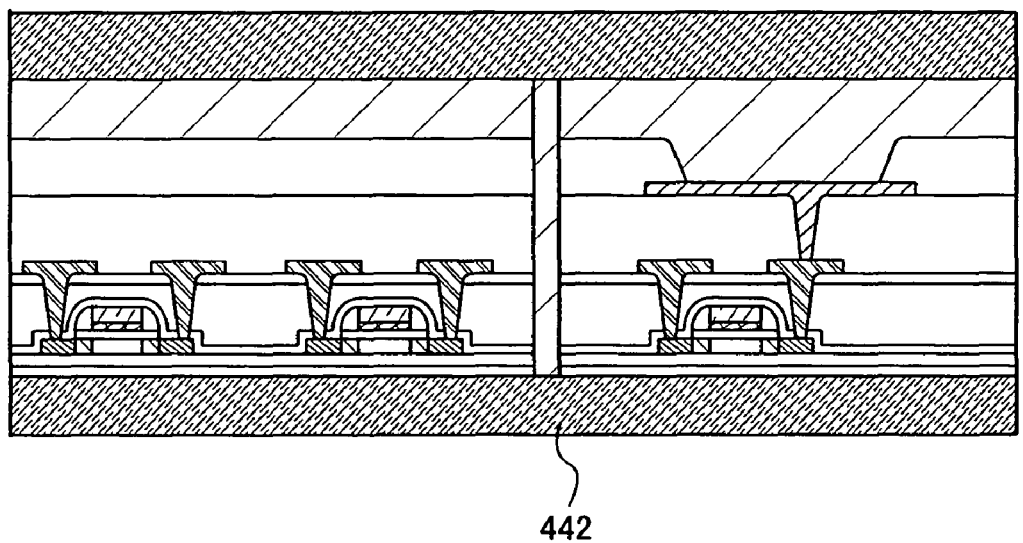

Then, as shown in FIG. 8B, a resin substrate 422 is attached instead of the peeled glass substrate 401. Note that the resin substrate 442 may be formed by using a similar material to that of the resin substrate 440.

As a result of peeling the memory device off the glass substrate 401 in this manner, reduction in thickness and weight of a memory device can be achieved as well as proving higher flexibility and higher shock resistance.

Subsequently, the substrate is divided into each memory device, so that multiple memory devices can be obtained in one substrate. As a result, cost reduction of the memory device can be achieved.

Further, a protective layer such as a gas barrier layer may be provided on each surface of the resin substrates 440 and 442. The provision of the protective layer can prevent intrusion of oxygen and alkaline elements, thereby the reliability can be improved. The protective layer is formed by using an inorganic material containing nitrogen, such as an aluminum nitride film or a silicon nitride film.

Although this embodiment mode illustrates a mode where the glass substrate 401 is removed and the resin substrates 440 and 442 are attached, the invention is not limited to this. Note that reduction in weight and thickness of a display device can be achieved by removing the glass substrate 401.

Further, although this embodiment mode illustrates a thin film transistor having a stacked-layer structure of a semiconductor layer, a gate insulating layer and a gate electrode layer in this order over a substrate, the thin film transistor of the invention is not limited to this structure, and such a structure may be adopted that a gate electrode layer, an insulating layer and a semiconductor layer are stacked in this order. Furthermore, altough the thin film transistor has impurity regions such as the first impurity region (also referred to as a low concentration impurity region) 410 and the second impurity region (also referred to as a high concentration impurity region) 411, the invention is not limited to these, and a single-drain structure having a uniform concentration of impurities may be adopted.

In addition, a multilayer structure may be adopted where multiple thin film transistors shown in this embodiment mode are stacked. In the case of manufacturing such a multilayer structure, a low dielectric constant (low-k) material is preferably used as a material of an insulating layer in order to reduce parasitic capacitance that is generated in the insulating layer between the stacked thin film transistors. For example, in addition to the aforementioned materials, there is a resin material such as an epoxy resin or an acrylic resin, and an organic material such as siloxane. By using the multilayer structure parasitic capacitance, reduction of areas, high-speed operation and low power consumption of the memory device can be achieved.

In this manner, the invention can provide a memory device having stacked memory material layers. Thus, a memory capacity of the memory device can be increased.

Note that this embodiment mode can be appropriately implemented in combination with any of the aforementioned embodiment modes.

[Embodiment Mode 5]

In this embodiment, description is made on a structure of a memory element that is formed by utilizing an opening for forming a source electrode or a drain electrode.

Figure 9A:
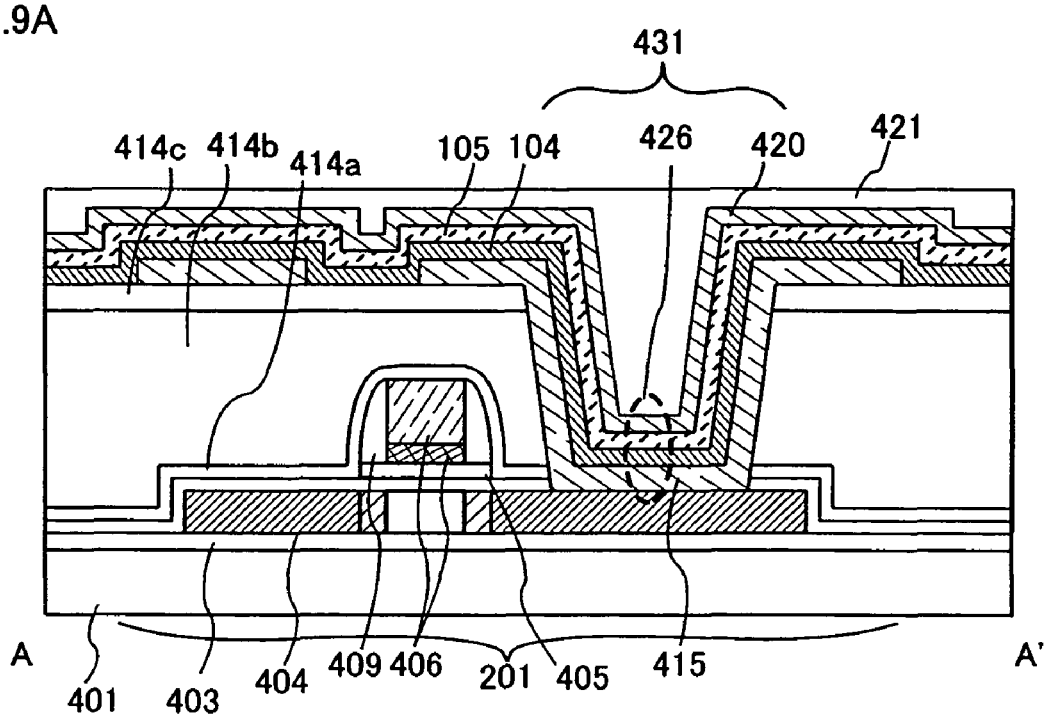
FIGS. 9A and 9B illustrate a manufacturing step of a memory element of the invention.

As shown in FIG. 9A, a thin film transistor is formed in the memory element region 201. The thin film transistor is obtained by forming the insulating layer 403, the semiconductor layer 404, the gate insulating layer 405, the gate electrode layer 406, the sidewall 409, and the insulating layers 414a, 414b and 414c over the glass substrate 401 as in the aforementioned embodiment mode. Then, an opening 431 is formed in the insulating layers 414a, 414b and 414c so as to expose the second impurity region. The opening 431 may be formed by dry etching, wet etching or the like. Side faces of the opening 431 are preferably tapered, which can prevent breaking of memory material layers to be formed later.

Subsequently, the conductive layer 415 is formed to fill the opening 431 as in the aforementioned embodiment mode, and the conductive layer 415 is patterned into a predetermined shape to form a source electrode or a drain electrode. Then, the first memory material layer 104, the second memory material layer 105 and the counter electrode 420 are formed in this order in the opening 431, as in the aforementioned embodiment mode. In this manner, the memory element 426 can be formed. The memory material layers are preferably formed by vapor deposition in order to prevent breaking thereof.

Further, the insulating layer 421 is preferably formed in order to prevent intrusion of impurity elements, moisture and oxygen.

Figure 9B:
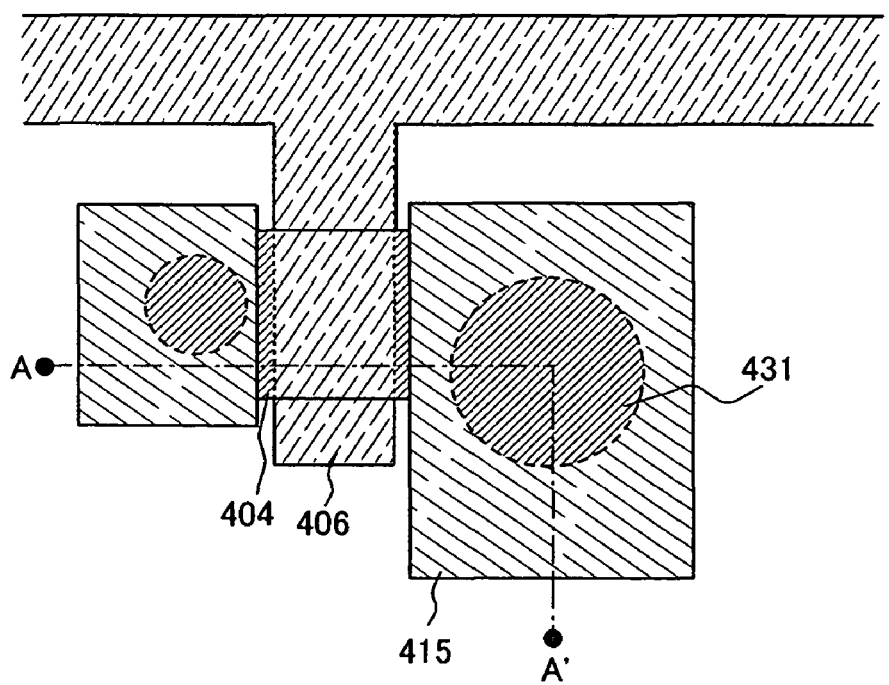

FIG. 9B shows a top view where the opening 431 is filled with the conductive layer 415, and the conductive layer 415 is patterned into a predetermined shape. As can be seen from FIG. 9B, the opening 431 on the side for forming a memory element is preferably formed to have a larger diameter than the other opening. For example, the diameter is set to 1 to 3 μm.

In this manner, the memory element 426 can be formed by utilizing the opening 431, thereby the memory device can be reduced in thickness. Further, since a source electrode or a drain electrode functions as the bottom electrode of the memory element in this embodiment mode, the number of manufacturing steps can be reduced, thereby cost reduction can be achieved.

Note that this embodiment mode can be appropriately implemented in combination with any of the aforementioned embodiment modes.

[Embodient Mode 6]

In this embodiment mode, description is made on a structure of a passive memory device.

Figure 10:
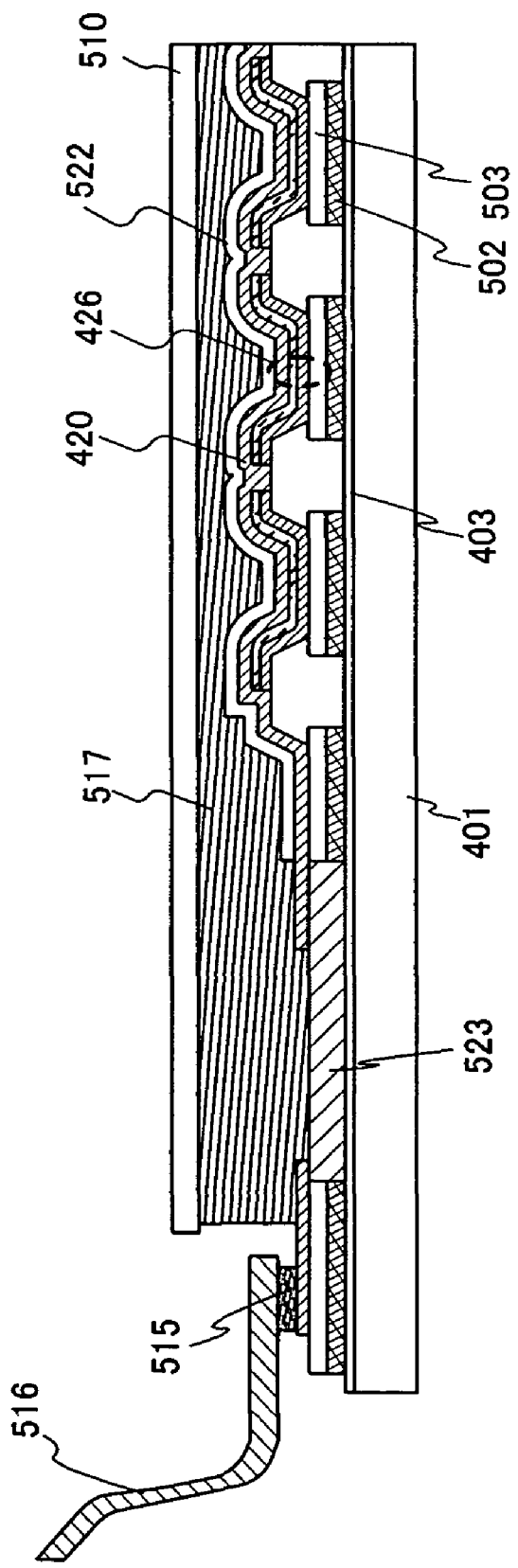
FIG. 10 is a cross-sectional view of a memory element of the invention.

As shown in FIG. 10, the insulating layer 403 is provided over the glass substrate 401, and a first conductive layer 502 and a second conductive layer 503 to be an electrode are stacked thereover. Needless to say, the electrode may have a single-layer structure. By controlling the electrode, the memory elements 426 that are disposed in a two-dimensional matrix can be controlled.

The memory element 426 has the first memory material layer 104, the second memory material layer 105 and the counter electrode 420 that are formed similarly to the aforementioned embodiment modes. In the case of forming a passive memory element, the first memory material layer 104 and the second memory material layer 105 are preferably patterned in each memory cell in order that a breakdown of the memory material layers will have no effect on adjacent memory cells.

A control circuit 523 formed of a polycrystalline semiconductor film may be formed over the same glass substrate 401 as the memory element 426. The control circuit 523 includes a decoder circuit connected to the counter electrode 420, a decoder circuit connected to the first conductive layer 502 and the like. The control circuit 523 is connected to an external circuit by using a bump 515 formed of an anisotropic conductive material to receive external signals or the like through a flexible printed circuit 516.

In order to prevent intrusion of impurity elements or moisture, a passivation film 522 is preferably provided over the counter electrode 420. The passivation film 522 may be formed by using an insulating layer containing nitrogen. In the case of using a silicon nitride film, light transmissivity in the near-ultraviolet region is slightly lowered. Therefore, in order to improve the light transmissivity, a silicon nitride oxide film to which oxygen is added may be used. Alternatively, an aluminum nitride film or an aluminum nitride oxide film may be used as the passivation film 522.

Since a passive memory element does not require an area for a transistor unlike an active memory element, the memory device can be reduced in size even if a control circuit is incorporated therein.

A sealing step of the memory element 426 is carried out by using a sealant 517 and a sealing substrate 510 provided over the passivation film 522. The sealing substrate 510 may be formed of metals such as stainless steel or aluminum as well as glass or plastic. Plastic includes acrylic, polyethylene terephthalate (PET) or the like, and may be provided in the form of a flat plate or a film. When plastic is used for the sealing substrate 510, a protective film such as a gas barrier film for blocking moisture vapor or the like, or a hard coat film for hardening the surface may be provided. With such a structure, intrusion of moisture or the like that would cause a degradation of the memory material layers can be prevented.

The sealant 517 provided between the sealing substrate 510 and the passivation film 522 is formed by using a resin material such as an epoxy resin, a silicone resin, a phenol resin or a urethane resin. The sealant 517 has a function to secure the sealing substrate 510 and the glass substrate 401 as well as to keep an even distance between the both substrates. Therefore, the sealant 517 may contain silica particles to function as spacers.

In this manner, the control circuit 523 can be formed over the same substrate as memory elements in a passive memory device. Needless to say, a control circuit can be formed over the same substrate as memory elements in an active memory device as well.

Note that a control circuit formed in an IC chip can be externally attached to a passive memory device. In this case, the control circuit 523 may be connected to the first conductive layer 502 and the second conductive layer 503 by using a bump formed of an anisotropic conductive material or the like. Needless to say, such a mode that a control circuit formed in an IC chip is externally attached can be applied to an active memory device as well.

This embodiment mode can be appropriately implemented in combination with any of the aforementioned embodiment modes.

[Embodiment Mode 7]

In this embodiment mode, description is made on a configuration of a memory device having memory elements that are manufactured in accordance with the aforementioned embodiment mode.

Figure 11:
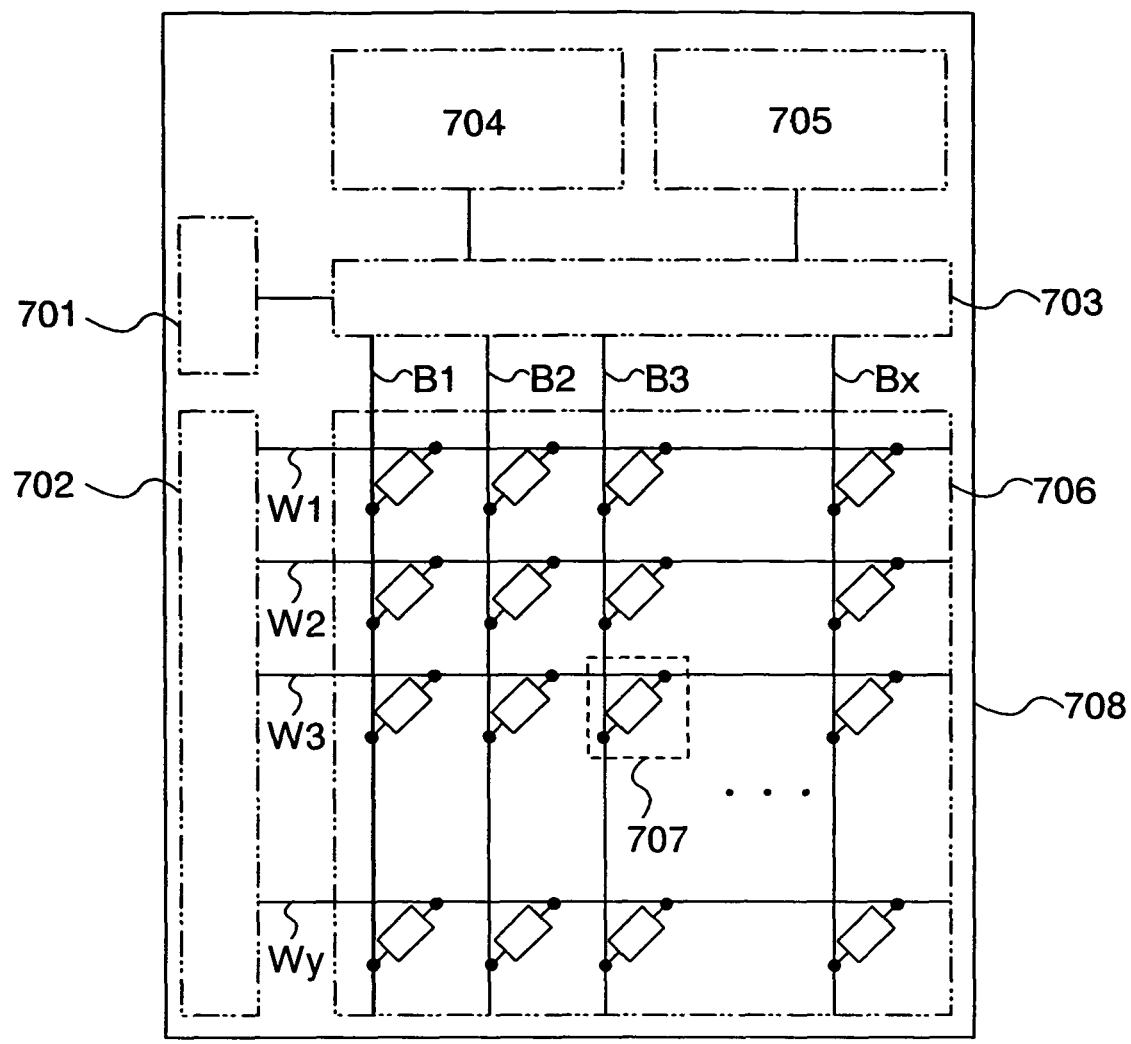
FIG. 11 is a block diagram of a memory device having a memory element of the invention.

As shown in FIG. 11, a memory device 708 includes a memory cell array 706 where memory elements are formed, and a control circuit. The control circuit includes a column decoder 701, a row decoder 702, a read circuit 704, a write circuit 705 and a selector 703.

The memory cell array 706 has a bit line Bm (m=1 to x), a word line Wn (n=1 to y) and a memory element 707 at each intersection of the bit line and the word line. The memory element has stacked memory material layers as shown in the aforementioned embodiment modes. The memory element in the memory cell array 706 may be either of an active element to which a transistor is connected, or a passive element to which no transistor is connected. The bit line is controlled by the selector 703 and the word line is controlled by the row decoder 702.

The column decoder 701 receives an address signal for specifying a column of the memory cell array 706, and sends the signal to the selector 703 of the selected column. The selector 703 receives a signal from the column decoder 701 and selects a specified bit line. The row decoder 702 receives an address signal for specifying a row of the memory cell array 706, and selects the specified word line. Through the aforementioned operation, one memory element 707 corresponding to the address signal is selected. The read circuit 704 reads out data from the selected memory element, and preferably amplifies the data to be outputted. The write circuit 705 generates a voltage necessary for writing, and applies the voltage to a selected memory element, so that memory material layers are sequentially destroyed to obtain a desired state, thereby data is written.

The invention can provide a memory device having such a control circuit.

Next, description is made on an equivalent circuit of a memory cell having the memory element 707.

Figure 12A:
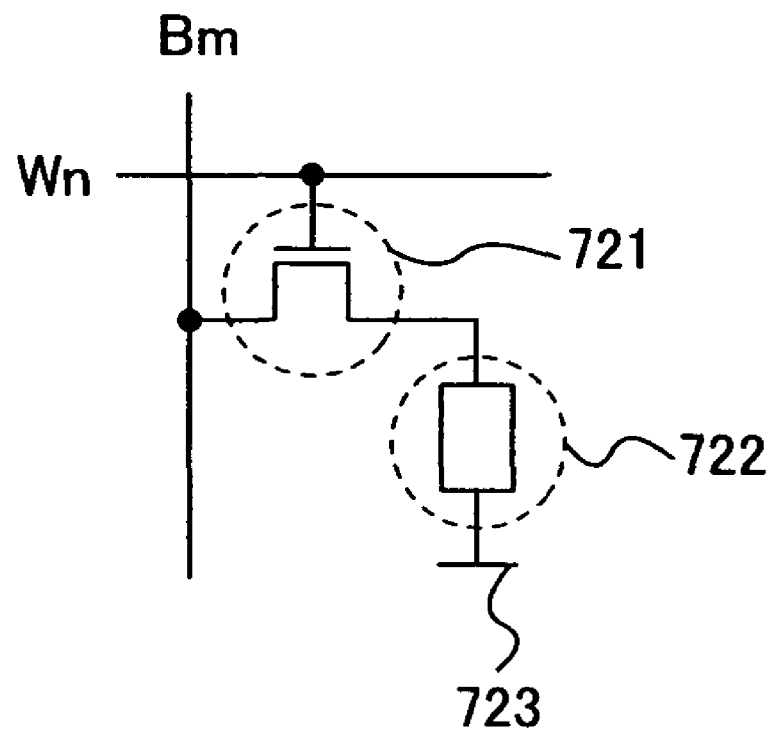
FIGS. 12A and 12B are equivalent circuit diagrams of memory elements of the invention.

As shown in FIG. 12A, the active memory cell has a transistor 721 and a memory element 722. A gate electrode of the transistor 721 is connected to a word line Wn and one of a source electrode and a drain electrode thereof is connected to a bit line Bm while the other is connected to the memory element 722. The memory element 722 has a bottom electrode, stacked memory material layers and a top electrode as described in the aforementioned embodiment modes. The transistor 721 may be a thin film transistor shown in the aforementioned embodiment modes. One of the source electrode and the drain electrode of the transistor 721 is electrically connected to the bottom electrode of the memory element 722. The top electrode (which corresponds to 723) of the memory element 722 can be shared by each memory element; therefore, it is not required to be patterned. When data is written or read to/from the memory device, the same voltage is applied to the top electrodes of all the cells.

Depending on a voltage value applied through the transistor 721 and the number of stacked memory material layers, the memory element 722 can have multiple states as shown in FIG. 2 or FIG. 4. Thus, multivalued data can be written into the memory element.

Figure 12B:
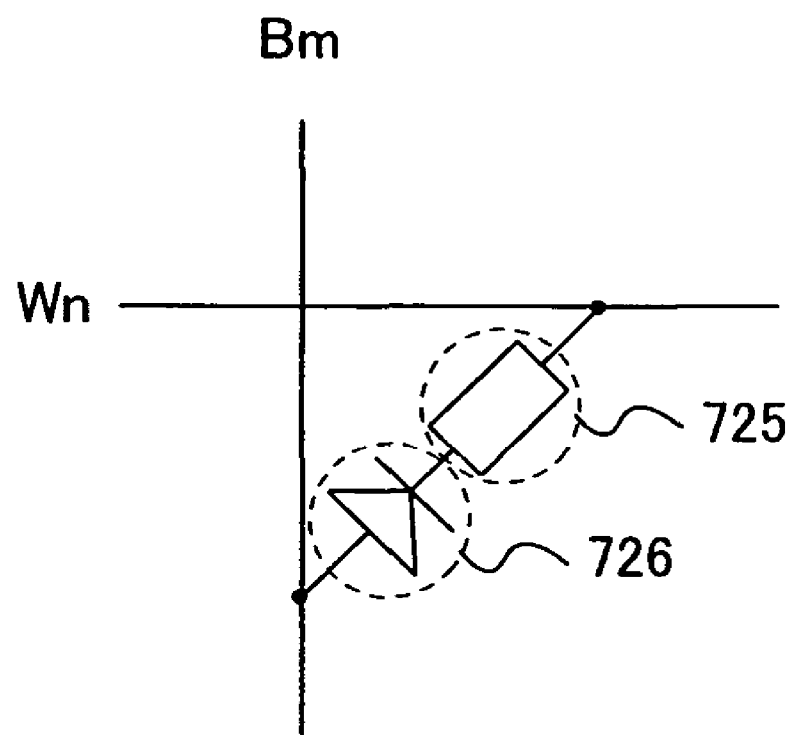

Alternatively, a passive memory cell as shown in FIG. 12B may be used, in which a memory element 725 is connected to a diode 726. The diode 726 may have a so-called diode-connected structure where one of a source electrode and a drain electrode of a transistor is connected to a gate electrode thereof. As the diode 726, a diode formed at a contact portion between a memory material layer and a bottom electrode may be used, or a diode formed at a contact portion between stacked memory material layers may be used.

This embodiment mode can be appropriately implemented in combination with any of the aforementioned embodiment modes.

[Embodiment Mode 8]

In this embodiment mode, description is made on a mode of a semiconductor device for wireless data communication, which has a memory device incorporated with a control circuit, and an antenna. Such a semiconductor device for wireless data communication may be called an RFID (Radio Frequency Identification).

Figure 13:
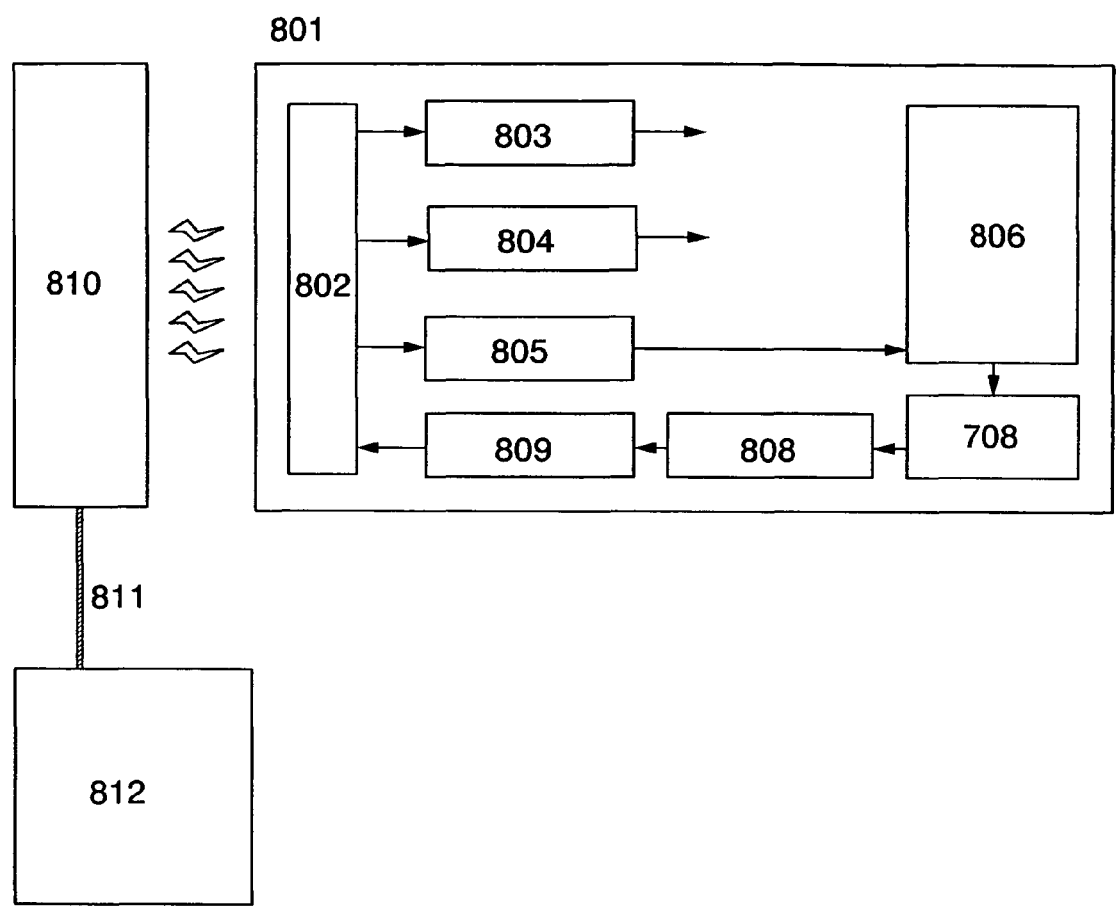
FIG. 13 is a block diagram of a semiconductor device mounted with a memory device of the invention.

A semiconductor device 801 shown in FIG. 13 has a resonant circuit 802 including an antenna and a resonant capacitor, a power supply circuit 803, a clock generation circuit 804, a demodulation circuit 805, an instruction analyzer/control circuit 806, the memory device 708, an encoding circuit 808 and a modulation circuit 809. The memory device 708 has stacked memory material layers as shown in the aforementioned embodiment modes. Note that the semiconductor device 801 of the invention is not limited to the aforementioned configuration, but may have a random number generation circuit, an encryption circuit, a central processing unit (CPU), a congestion control circuit or the like. In addition, the semiconductor device 801 is not limited to the configuration having an antenna, but may have only a wire connected to the antenna. In such a case, data from a memory device can be obtained by connecting a separately provided antenna to the wire in sending/receiving data from/to the semiconductor device.

Since the semiconductor device 801 of the invention has the resonant circuit 802 including an antenna, it can receive power from electromagnetic waves generated from a reader/writer device 810, and can send/receive data wirelessly to/from the reader/writer device 810. The reader/writer device 810 is connected to a computer 812 through a communication line 811, and supplies power to the semiconductor device 801 as well as sending/receiving data to/from the semiconductor device 801 under the control of the computer 812.

The resonant circuit 802 receives electromagnetic waves generated from the reader/writer device 810, and then generates induced voltage. This induced voltage includes power to be supplied to the semiconductor device 801 as well as data sent from the reader/writer device 810. The power supply circuit 803 rectifies the induced voltage generated in the resonant circuit 802 with a diode, and stabilizes the rectified voltage with a capacitor to be supplied to each circuit. The clock generation circuit 804 generates clock signals with a required frequency based on the induced voltage generated in the resonant circuit 802. The demodulation circuit 805 demodulates the induced voltage generated in the resonant circuit 802 into data. The instruction analyzer/control circuit 806 has a data determination circuit (checksum circuit) and checks the demodulated data. In addition, the instruction analyzer/control circuit 806 generates memory control signals in accordance with an instruction received, and controls the memory device 708. The memory device 708 stores data specific to the semiconductor device 801. The memory device 708 is manufactured through the steps shown in the aforementioned embodiment modes. The encoding circuit 808 converts data to be sent into an encoded signal. The modulation circuit 809 modulates carrier waves based on the encoded signal.

Although this embodiment mode illustrates an example where the semiconductor device 801 receives power from the reader/writer device 810, the invention is not limited to this mode. For example, the semiconductor device 801 may have an internal battery or the like to receive power from the battery, so that it can send/receive data wirelessly to/from the reader/writer device.

This embodiment mode can be appropriately implemented in combination with any of the aforementioned embodiment modes.

[Embodiment Mode 9]

An electronic appliance provided with the semiconductor device of the invention includes a television set (also simply called a television or a television receiver), a digital camera, a digital video camera, a portable phone apparatus (also simply called a portable phone set or a portable phone), a portable information terminal such as a PDA, a portable game machine, a computer monitor, a computer, an audio reproducing apparatus such as a car audio system, an image reproducing apparatus provided with a recording medium such as a home-use game machine, or the like. Specific examples of such an electronic appliance are described with reference to FIGS. 14A to 14F.

Figure 14A:
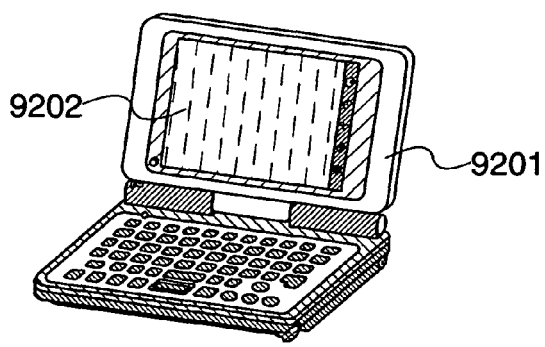
FIGS. 14A to 14F are views each illustrating an electronic appliance mounted with a memory device of the invention.

A portable information terminal shown in FIG. 14A includes a main body 9201, a display portion 9202 and the like. The memory device of the invention can be applied to the portable information terminal. Since a memory capacity can be increased with the memory element of the invention, the memory device can be reduced in size. Further, by forming the memory element over a resin substrate, the memory device can be reduced in thickness. By using such a memory device, the portable information terminal can be provided with a higher added value.

Figure 14B:
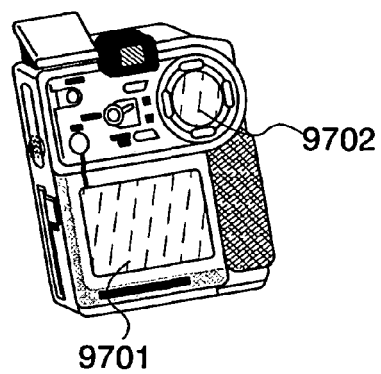

A digital video camera shown in FIG. 14B includes a display portion 9701, a display portion 9702 and the like. The memory device of the invention can be applied to the digital video camera. Since a memory capacity can be increased with the memory element of the invention, the memory device can be reduced in size. Further, by forming the memory element over a resin substrate, the memory device can be reduced in thickness. By using such a memory device, the digital video camera can be provided with a higher added value.

Figure 14C:
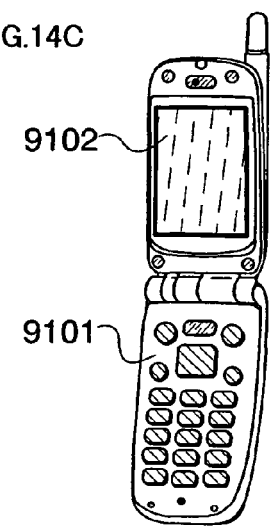

A portable phone set shown in FIG. 14C includes a main body 9101, a display portion 9102 and the like. The memory device of the invention can be applied to the portable phone set. Since a memory capacity can be increased with the memory element of the invention, the memory device can be reduced in size. Further, by forming the memory element over a resin substrate, the memory device can be reduced in thickness. By using such a memory device, the portable phone set can be provided with a higher added value.

Figure 14D:
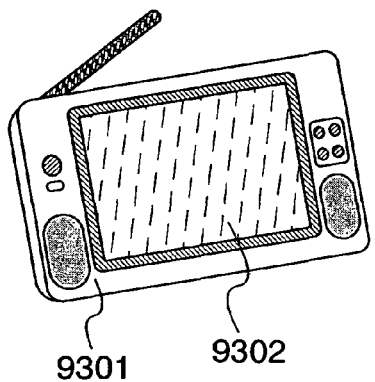

A portable television set shown in FIG. 14D includes a main body 9301, a display portion 9302 and the like. The memory device of the invention can be applied to the portable television set. Since a memory capacity can be increased with the memory element of the invention, the memory device can be reduced in size. Further, by forming the memory element over a resin substrate, the memory device can be reduced in thickness. By using such a memory device, the portable television set can be provided with a higher added value. The portable television set includes those of a small size to be mounted on a portable terminal such as a portable phone set, a medium size for portable applications, and a large size (for example, 40 inches or larger). Thus, the semiconductor device of the invention can be applied to a variety of television sets.

Figure 14E:
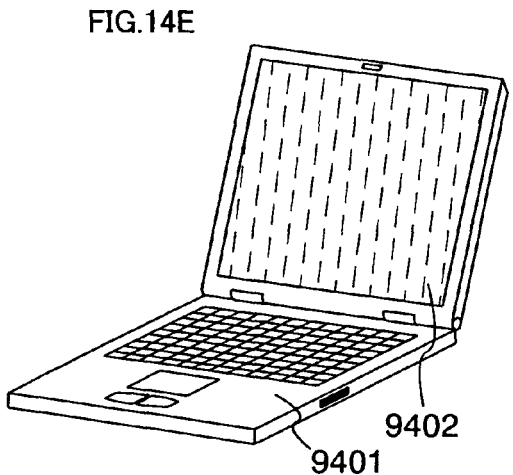

A portable computer shown in FIG. 14E includes a main body 9401, a display portion 9402 and the like. The memory device of the invention can be applied to the portable computer. Since a memory capacity can be increased with the memory element of the invention, the memory device can be reduced in size. Further, by forming the memory element over a resin substrate, the memory device can be reduced in thickness. By using such a memory device, the portable computer can be provided with a higher added value.

Figure 14F:
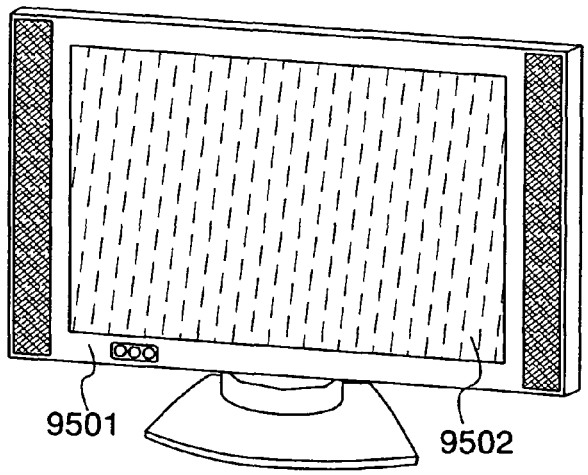

A television set shown in FIG. 14F includes a main body 9501, a display portion 9502 and the like. The memory device of the invention can be applied to the television set. Since a memory capacity can be increased with the memory element of the invention, the memory device can be reduced in size. Further, by forming the memory element over a resin substrate, the memory device can be reduced in thickness. By using such a memory device, the television set can be provided with a higher added value.

In accordance with the invention, a memory capacity of a memory element can be increased, thereby an electronic appliance having a memory device can be provided with a higher added value.

The present application is based on Japanese Priority application No. 2005-055216 filed on Feb. 28, 2005 with the Japanese Patent Office, the entire contents of which are hereby incorporated by reference.

What is claimed is:

1. A semiconductor device including a memory element comprising:
   a bottom electrode;
   a first layer formed of an inorganic material on and in contact with the bottom electrode;
   a second layer consisting essentially of an organic material over the first layer;
   a top electrode provided in contact with the second layer; and
   a third layer provided between and in contact with the first layer and the second layer,
   wherein each of the first layer and the second layer has a different dielectric constant and is configured such that at least one of the first layer and the second layer is destroyed due to an application of a first voltage, and
   wherein the third layer is a layer formed of a mixture of an organic compound and a metal oxide.

2. The semiconductor device including the memory element according to claim 1, wherein the first layer has a lower dielectric constant than the second layer.

3. The semiconductor device including the memory element according to claim 1, wherein the second layer is thicker than the first layer.

4. The semiconductor device including the memory element according to claim 1, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

5. The semiconductor device including the memory element according to claim 1, which is provided over a resin substrate.

6. The semiconductor device including the memory element according to claim 1, wherein the memory element having the bottom electrode, the first layer, the second layer, and the top electrode are formed over the same substrate as a circuit for controlling the memory element.

7. A semiconductor device including a memory element comprising:
   a bottom electrode;
   a first layer formed of an inorganic material on and in contact with the bottom electrode;

a second layer consisting essentially of an organic material over the first layer;
a top electrode provided in contact with the second layer; and
a third layer provided between and in contact with the first layer and the second layer,
wherein each of the first layer and the second layer has a different withstand voltage and is configured such that at least one of the first layer and the second layer is destroyed due to an application of a first voltage, and
wherein the third layer is a layer formed of a mixture of an organic compound and a metal oxide.

8. The semiconductor device including the memory element according to claim 7, wherein the first layer has a lower withstand voltage than the second layer.

9. The semiconductor device including the memory element according to claim 7, wherein the second layer is thicker than the first layer.

10. The semiconductor device including the memory element according to claim 7, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

11. The semiconductor device including the memory element according to claim 7, which is provided over a resin substrate.

12. The semiconductor device including the memory element according to claim 7, wherein the memory element having the bottom electrode, the first layer, the second layer, and the top electrode are formed over the same substrate as a circuit for controlling the memory element.

13. A semiconductor device including a memory element comprising:
a bottom electrode;
a first layer formed of an inorganic material on and in contact with the bottom electrode;
a second layer consisting essentially of an organic material over the first layer;
a top electrode provided in contact with the second layer; and
a third layer provided between and in contact with the first layer and the second layer,
wherein each of the first layer and the second layer has a different glass-transition temperature and is configured such that at least one of the first layer and the second layer is destroyed due to an application of a first voltage, and
wherein the third layer is a layer formed of a mixture of an organic compound and a metal oxide.

14. The semiconductor device including the memory element according to claim 13, wherein the first layer has a lower glass-transition temperature than the second layer.

15. The semiconductor device including the memory element according to claim 13, wherein the second layer is thicker than the first layer.

16. The semiconductor device including the memory element according to claim 13, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

17. The semiconductor device including the memory element according to claim 13, which is provided over a resin substrate.

18. The semiconductor device including the memory element according to claim 13, wherein the memory element having the bottom electrode, the first layer, the second layer, and the top electrode are formed over the same substrate as a circuit for controlling the memory element.

19. A semiconductor device including a memory element comprising:
a bottom electrode;
a first layer formed of an inorganic material on and in contact with the bottom electrode;
a second layer consisting essentially of an organic material over the first layer;
a top electrode provided over the second layer;
a third layer provided between the first layer and the second layer,
wherein the first layer formed of the inorganic material is $SiO_2$ film that is doped with C and H, and
wherein each of the first layer and the second layer has a different dielectric constant and is configured such that at least one of the first layer and the second layer is destroyed due to an application of a first voltage.

20. The semiconductor device including the memory element according to claim 19, wherein the first layer has a lower dielectric constant than the second layer.

21. The semiconductor device including the memory element according to claim 19, wherein the second layer is thicker than the first layer.

22. The semiconductor device including the memory element according to claim 19, wherein the third layer is formed of a heat-generating material.

23. The semiconductor device including the memory element according to claim 19, wherein the third layer is formed of a metal material.

24. The semiconductor device including the memory element according to claim 19, wherein the third layer is formed of a mixture of an organic compound and a metal oxide.

25. The semiconductor device including the memory element according to claim 24, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

26. The semiconductor device including the memory element according to claim 19, which is provided over a resin substrate.

27. The semiconductor device including the memory element according to claim 19, wherein the memory element having the bottom electrode, the first layer, the second layer, and the top electrode are formed over the same substrate as a circuit for controlling the memory element.

28. A semiconductor device including a memory element comprising:
a bottom electrode;
a first layer formed of an inorganic material on and in contact with the bottom electrode;
a second layer consisting essentially of an organic material over the first layer;
a top electrode provided over the second layer;
a third layer provided between the first layer and the second layer,
wherein the first layer formed of the inorganic material is $SiO_2$ film that is doped with C and H, and
wherein each of the first layer and the second layer has a different withstand voltage and is configured such that at least one of the first layer and the second layer is destroyed due to an application of a first voltage.

29. The semiconductor device including the memory element according to claim 28, wherein the first layer has a lower withstand voltage than the second layer.

30. The semiconductor device including the memory element according to claim 28, wherein the second layer is thicker than the first layer.

31. The semiconductor device including the memory element according to claim 28, wherein the third layer is formed of a heat-generating material.

32. The semiconductor device including the memory element according to claim 28, wherein the third layer is formed of a metal material.

33. The semiconductor device including the memory element according to claim 28, wherein the third layer is formed of a mixture of an organic compound and a metal oxide.

34. The semiconductor device including the memory element according to claim 33, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

35. The semiconductor device including the memory element according to claim 28, which is provided over a resin substrate.

36. The semiconductor device including the memory element according to claim 28, wherein the memory element having the bottom electrode, the first layer, the second layer, and the top electrode are formed over the same substrate as a circuit for controlling the memory element.

37. A semiconductor device including at least first and second memory elements, each comprising:
   a bottom electrode;
   a first layer formed of an inorganic material on and in contact with the bottom electrode;
   a second layer consisting essentially of an organic material over the first layer;
   the first layer and the second layer having a different dielectric constant;
   a top electrode provided on and in contact with the second layer; and
   a third layer provided between and in contact with the first layer and the second layer,
   wherein the bottom electrode and the top electrode in at least one of the first and second memory elements are configured such that the bottom electrode and the top electrode are short-circuited through at least one of the first layer and the second layer, and
   wherein the third layer is a layer formed of a mixture of an organic compound and a metal oxide.

38. The semiconductor device including at least first and second memory elements according to claim 37, wherein the first layer has a lower dielectric constant than the second layer.

39. The semiconductor device including at least first and second memory elements according to claim 37, wherein the second layer is thicker than the first layer.

40. The semiconductor device including at least first and second memory elements according to claim 37, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

41. The semiconductor device including at least first and second memory elements according to claim 37, which is provided over a resin substrate.

42. The semiconductor device including at least first and second memory elements according to claim 37, wherein the memory element having the bottom electrode, the first layer, the second layer, and the top electrode are formed over the same substrate as a circuit for controlling the memory element.

43. A semiconductor device including at least first and second memory elements, each comprising:
   a bottom electrode;
   a first layer formed of an inorganic material on and in contact with the bottom electrode;
   a second layer consisting essentially of an organic material over the first layer;
   the first layer and the second layer having a different withstand voltage;
   a top electrode provided on and in contact with the second layer; and
   a third layer provided between and in contact with the first layer and the second layer,
   wherein the bottom electrode and the top electrode in at least one of the first and second memory elements are configured such that the bottom electrode and the top electrode are short-circuited through at least one of the first layer and the second layer, and
   wherein the third layer is a layer formed of a mixture of an organic compound and a metal oxide.

44. The semiconductor device including at least first and second memory elements according to claim 43, wherein the first layer has a lower withstand voltage than the second layer.

45. The semiconductor device including at least first and second memory elements according to claim 43, wherein the second layer is thicker than the first layer.

46. The semiconductor device including at least first and second memory elements according to claim 43, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

47. The semiconductor device including at least first and second memory elements according to claim 43, which is provided over a resin substrate.

48. The semiconductor device including at least first and second memory elements according to claim 43, wherein the memory element having the bottom electrode, the first layer, the second layer, and the top electrode are formed over the same substrate as a circuit for controlling the memory element.

49. A semiconductor device including at least first and second memory elements, each comprising:
   a bottom electrode;
   a first layer formed of an inorganic material on and in contact with the bottom electrode;
   a second layer consisting essentially of an organic material over the first layer;
   the first layer and the second layer having a different glass-transition temperature;
   a top electrode provided on and in contact with the second layer; and
   a third layer provided between and in contact with the first layer and the second layer,
   wherein the bottom electrode and the top electrode in at least one of the first and second memory elements are configured such that the bottom electrode and the top electrode are short-circuited through at least one of the first layer and the second layer, and
   wherein the third layer is a layer formed of a mixture of an organic compound and a metal oxide.

50. The semiconductor device including at least first and second memory elements according to claim 49, wherein the first layer has a lower glass-transition temperature than the second layer.

51. The semiconductor device including at least first and second memory elements according to claim 49, wherein the second layer is thicker than the first layer.

52. The semiconductor device including at least first and second memory elements according to claim 49, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

53. The semiconductor device including at least first and second memory elements according to claim 49, which is provided over a resin substrate.

54. The semiconductor device including at least first and second memory elements according to claim 49, wherein the memory element having the bottom electrode, the first layer, the second layer, and the top electrode are formed over the same substrate as a circuit for controlling the memory element.

55. A semiconductor device including a memory element comprising:
a bottom electrode;
a first layer formed of an inorganic material on and in contact with the bottom electrode;
a second layer consisting essentially of an organic material over the first layer;
a top electrode provided over the second layer;
a third layer provided between the first layer and the second layer,
wherein the first layer formed of the inorganic material is $SiO_2$ film that is doped with C and H, and
wherein each of the first layer and the second layer has a different glass-transition temperature and is configured such that at least one of the first layer and the second layer is destroyed due to an application of a first voltage.

56. The semiconductor device including the memory element according to claim 55, wherein the first layer has a lower glass-transition temperature than the second layer.

57. The semiconductor device including the memory element according to claim 55, wherein the second layer is thicker than the first layer.

58. The semiconductor device including the memory element according to claim 55, wherein the third layer is formed of a heat-generating material.

59. The semiconductor device including the memory element according to claim 55, wherein the third layer is formed of a metal material.

60. The semiconductor device including the memory element according to claim 55, wherein the third layer is formed of a mixture of an organic compound and a metal oxide.

61. The semiconductor device including the memory element according to claim 60, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide, or a tantalum oxide.

62. The semiconductor device including the memory element according to claim 55, which is provided over a resin substrate.

63. The semiconductor device including the memory element according to claim 55, wherein the memory element having the bottom electrode, the first layer, the second layer, and the top electrode are formed over the same substrate as a circuit for controlling the memory element.

64. A semiconductor device including at least first and second memory elements, each comprising:
a bottom electrode;
a first layer formed of an inorganic material on and in contact with the bottom electrode;
a second layer consisting essentially of an organic material over the first layer;
the first layer and the second layer having a different dielectric constant;
a top electrode provided over the second layer; and
a third layer provided between the first layer and the second layer,
wherein the first layer formed of the inorganic material is $SiO_2$ film that is doped with C and H, and
wherein the bottom electrode and the top electrode in at least one of the first and second memory elements are configured such that the bottom electrode and the top electrode are short-circuited through at least one of the first layer and the second layer.

65. The semiconductor device including at least first and second memory elements according to claim 64, wherein the first layer has a lower dielectric constant than the second layer.

66. The semiconductor device including at least first and second memory elements according to claim 64, wherein the second layer is thicker than the first layer.

67. The semiconductor device including at least first and second memory elements according to claim 64, wherein the third layer is formed of a heat-generating material.

68. The semiconductor device including at least first and second memory elements according to claim 64, wherein the third layer is formed of a metal material.

69. The semiconductor device including at least first and second memory elements according to claim 64, wherein the third layer is a layer formed of a mixture of an organic compound and a metal oxide.

70. The semiconductor device including at least first and second memory elements according to claim 69, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

71. The semiconductor device including at least first and second memory elements according to claim 64, which is provided over a resin substrate.

72. The semiconductor device including at least first and second memory elements according to claim 64, wherein the memory element having the bottom electrode, the first layer, the second layer, and the top electrode are formed over the same substrate as a circuit for controlling the memory element.

73. A semiconductor device including at least first and second memory elements, each comprising:
a bottom electrode;
a first layer formed of an inorganic material on and in contact with the bottom electrode;
a second layer consisting essentially of an organic material over the first layer;
the first layer and the second layer having a different withstand voltage;
a top electrode provided over the second layer; and
a third layer provided between the first layer and the second layer,
wherein the first layer formed of the inorganic material is $SiO_2$ film that is doped with C and H, and
wherein the bottom electrode and the top electrode in at least one of the first and second memory elements are configured such that the bottom electrode and the top electrode are short-circuited through at least one of the first layer and the second layer.

74. The semiconductor device including at least first and second memory elements according to claim 73, wherein the first layer has a lower withstand voltage than the second layer.

75. The semiconductor device including at least first and second memory elements according to claim 55, wherein the second layer is thicker than the first layer.

76. The semiconductor device including at least first and second memory elements according to claim 73, wherein the third layer is formed of a heat-generating material.

77. The semiconductor device including at least first and second memory elements according to claim 73, wherein the third layer is formed of a metal material.

78. The semiconductor device including at least first and second memory elements according to claim 73, wherein the third layer is a layer formed of a mixture of an organic compound and a metal oxide.

79. The semiconductor device including at least first and second memory elements according to claim 78, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

80. The semiconductor device including at least first and second memory elements according to claim 73, which is provided over a resin substrate.

81. The semiconductor device including at least first and second memory elements according to claim 73, wherein the memory element having the bottom electrode, the first layer, the second layer, and the top electrode are formed over the same substrate as a circuit for controlling the memory element.

82. A semiconductor device including at least first and second memory elements, each comprising:
    a bottom electrode;
    a first layer formed of an inorganic material on and in contact with the bottom electrode;
    a second layer consisting essentially of an organic material over the first layer;
    the first layer and the second layer having a different glass-transition temperature;
    a top electrode provided over the second layer; and
    a third layer provided between the first layer and the second layer,
    wherein the first layer formed of the inorganic material is $SiO_2$ film that is doped with C and H, and
    wherein the bottom electrode and the top electrode in at least one of the first and second memory elements are configured such that the bottom electrode and the top electrode are short-circuited through at least one of the first layer and the second layer.

83. The semiconductor device including at least first and second memory elements according to claim 82, wherein the first layer has a lower glass-transition temperature than the second layer.

84. The semiconductor device including at least first and second memory elements according to claim 82, wherein the second layer is thicker than the first layer.

85. The semiconductor device including at least first and second memory elements according to claim 82, wherein the third layer is formed of a heat-generating material.

86. The semiconductor device including at least first and second memory elements according to claim 82, wherein the third layer is formed of a metal material.

87. The semiconductor device including at least first and second memory elements according to claim 82, wherein the third layer is a layer formed of a mixture of an organic compound and a metal oxide.

88. The semiconductor device including at least first and second memory elements according to claim 87, wherein the metal oxide is one of a vanadium oxide, a molybdenum oxide, a niobium oxide, a rhenium oxide, a tungsten oxide, a ruthenium oxide, a titanium oxide, a chromium oxide, a zirconium oxide, a hafnium oxide or a tantalum oxide.

89. The semiconductor device including at least first and second memory elements according to claim 82, which is provided over a resin substrate.

90. The semiconductor device including at least first and second memory elements according to claim 82, wherein the memory element having the bottom electrode, the first layer, the second layer, and the top electrode are formed over the same substrate as a circuit for controlling the memory element.

* * * * *